(12) United States Patent
Wachi

(10) Patent No.: US 8,351,867 B2
(45) Date of Patent: Jan. 8, 2013

(54) OSCILLATOR, FREQUENCY GENERATING CIRCUIT AND WIRELESS COMMUNICATION SYSTEM USING THE OSCILLATOR

(75) Inventor: Yusuke Wachi, Okegawa (JP)

(73) Assignee: Hitachi, Ltd., Tokyo (JP)

( * ) Notice: Subject to any disclaimer, the term of this patent is extended or adjusted under 35 U.S.C. 154(b) by 498 days.

(21) Appl. No.: 12/717,122

(22) Filed: Mar. 3, 2010

(65) Prior Publication Data

US 2010/0248647 A1 Sep. 30, 2010

(30) Foreign Application Priority Data

Mar. 31, 2009 (JP) ................................. 2009-085576

(51) Int. Cl.
*H04B 1/40* (2006.01)
(52) U.S. Cl. ............ 455/76; 455/73; 455/319; 455/126; 455/127.2; 455/226.2; 331/65; 331/109; 331/17; 331/116; 331/175; 331/167; 331/132; 331/117; 331/48; 331/25
(58) Field of Classification Search .................. None
See application file for complete search history.

(56) References Cited

U.S. PATENT DOCUMENTS

| | | | | | |
|---|---|---|---|---|---|
| 5,418,497 | A | * | 5/1995 | Martin | 331/48 |
| 7,610,022 | B1 | * | 10/2009 | Teo et al. | 455/73 |
| 2003/0146816 | A1 | | 8/2003 | Furumiya et al. | |
| 2004/0178857 | A1 | | 9/2004 | Jacobsson et al. | |
| 2004/0222862 | A1 | | 11/2004 | Majos | |
| 2007/0021088 | A1 | * | 1/2007 | Sheng-Fuh et al. | 455/319 |
| 2007/0164828 | A1 | * | 7/2007 | Uozumi et al. | 331/16 |
| 2008/0105054 | A1 | * | 5/2008 | Kanai et al. | 73/514.29 |
| 2008/0129399 | A1 | * | 6/2008 | Jang et al. | 331/117 FE |
| 2008/0174378 | A1 | * | 7/2008 | Cusmai et al. | 331/167 |

FOREIGN PATENT DOCUMENTS

| | | |
|---|---|---|
| JP | 2003-229485 A | 8/2003 |
| JP | 2004-023762 A | 1/2004 |
| JP | 2004-260301 A | 9/2004 |
| JP | 2004-304183 A | 10/2004 |
| JP | 2005-513826 A | 5/2005 |

OTHER PUBLICATIONS

D. B. Lesson, "A simple Model of Feedback Oscillator Noise Spectrum", Proc. IEEE, vol. 54, No. 2, pp. 329-330, Feb. 1966.
A. Hajimiri and T. H. Lee, "A General Theory of Phase Noise in Electrical Oscillators", IEEE J. Solid-State Circuits, vol. 33, pp. 179-194, Feb. 1998.

(Continued)

*Primary Examiner* — Matthew Anderson
*Assistant Examiner* — Ganiyu A Hanidu
(74) *Attorney, Agent, or Firm* — Miles & Stockbridge P.C.

(57) ABSTRACT

The present invention provides an oscillator and a communication system using the oscillator, in particular, an LC oscillator adapted to lessen phase noise deterioration due to harmonic distortions and increase the amplitude of oscillation, thereby having a favorable low phase noise characteristic. The oscillator comprises at least one voltage to current converter consisting of a transistor and a resonator comprising two LC tanks consisting of a pair of conductive elements and inductive elements. A feedback loop is formed such that an output terminal of the voltage to current converter is connected to the resonator and a current input to the resonator is converted to a voltage which is in turn fed back to an input terminal of the voltage to current converter. Inductive elements constituting the two LC tanks constituting the resonator are mutually inductively couple and a coefficient of the mutual induction is about −0.6.

20 Claims, 33 Drawing Sheets

OTHER PUBLICATIONS

P. C. Huang et al., "A 131 GHz Push-push VCO in 90-nm CMOS Technology", IEEE RFIC, 2005, pp. 613-616.

T. Song et al., "A 5GHz Transformer-Coupled CMOS VCO Using Bias-Level Shifting Technique", IEEE RFIC, 2004, pp. 127-130.

* cited by examiner

OSCILLATOR, FREQUENCY GENERATING CIRCUIT AND WIRELESS COMMUNICATION SYSTEM USING THE OSCILLATOR

CLAIM OF PRIORITY

The present application claims priority from Japanese Patent Application JP 2009-085576 filed on Mar. 31, 2009, the content of which is hereby incorporated by reference into this application.

FIELD OF THE INVENTION

The present invention relates to an oscillator as well as a frequency generating circuit (which may also be referred to as a frequency synthesizer herein) and a wireless communication system using the oscillator. Particularly, the invention relates to an LC oscillator suited for being incorporated in a communication system and a radar system operating in a frequency band of microwaves and milliwaves of a resonator in order to generate a carrier signal, as well as a frequency generating circuit (frequency synthesizer) and a wireless communication system using such oscillator.

BACKGROUND OF THE INVENTION

As an example of an LC oscillator with a resonator consisting of an inductor and a capacitor, such oscillator described in Japanese Patent Application Laid-Open Publication No. 2004-260301 is known. A description about phase noise power of an oscillator in a small signal model is found in D. B. Lesson, "A Simple Model of Feedback Oscillator Noise Spectrum," Proc. IEEE, vol. 54, pp. no. 2, 329-330, February 1966. Furthermore, a description about phase noise power in a large signal model is found in A. Hajimiri and T. H. Lee, "A general theory of phase noise in electrical oscillators," IEEE J. solid-State Circuits, Vol. 33, pp. 179-194. Meanwhile, an example of an LC cross coupled oscillator from which a tail current source was removed, in which a common ground point of a differential amplifier is directly coupled to a circuit ground, is described in P. C. Huang, "A 131 GHz Push-Push VCO in 90-nm CMOS Technology", IEEE RFIC, 2005. An example of an LC cross coupled oscillator without a tail current source is also described in T. Song, "A 5 GHz Transformer-Coupled CMOS VCO Using Bias-Level Shifting Technique", IEEE RFIC 2004.

Moreover, an example of an oscillator circuit wherein improving a phase noise characteristic has been done by approximating a series resonance frequency of a parallel resonator circuit to a parallel resonance frequency ultimately is described in Japanese Patent Application Laid-Open Publication No. 2004-023762.

SUMMARY OF THE INVENTION

Phase noise is an important index indicating the performance of an oscillator. As described in Japanese Patent Application Laid-Open Publication No. 2004-023762, an ideal output spectrum of an oscillator is represented by a linear spectrum, whereas the spectrum of a practical oscillator has a skirt characteristic in which phase variations occurring due to noise internal to the oscillator circuit and noise introduced from outside of the circuit extend at each side of an oscillation frequency by phase modulation, as is expressed in Equation (1).

$$v_{out} = A_0(\omega_0 t + \beta \sin\omega_m t) \qquad (1)$$
$$= -\frac{\beta A_0}{2}\cos(\omega_0 - \omega_m)t + A_0\cos\omega_0 + \frac{\beta A_0}{2}\cos(\omega_0 + \omega_m)t$$

Equation (1) formulates phase variations of an oscillation signal, given that $\omega_0$ is an oscillation frequency and $\beta \sin \omega_m$ is a sine wave of the frequency $\omega_0$ ($<\omega_0$). $A0 \cos \omega_0$, the second term in the second line in Equation (1) is an ideal oscillator output signal and the first and third term at each side of it represent noise signals which are phase modulated signals with a frequency shifted around $\omega_0$, i.e., phase noises. A phase noise is defined by a ratio between an oscillation output level at the oscillation frequency and a noise level at a frequency separated by certain frequency spacing apart from the oscillation frequency. The phase noise characteristic is regarded as most important to sustain a quality of a communication system and transmit information without error.

According to D. B. Lesson, "A Simple Model of Feedback Oscillator Noise Spectrum," Proc. IEEE, vol. 54, pp. no. 2, 329-330, February 1966, the phase noise of an oscillator in a small signal model is formulated by the following Equation (2).

$$S(\Delta f) = 10\mathrm{Log}\left[1 + \frac{1}{\Delta f^2}\left(\frac{f_0}{2Q}\right)^2 + \frac{fc}{\Delta f^3}\left(\frac{f_0}{2Q}\right)^3\right] + 10\mathrm{Log}\frac{FvKT}{P_0} \qquad (2)$$

Here, fc, $\Delta f$, Q, Po, and Fv denote an oscillation frequency, an offset frequency from fc, a resonator quality factor, oscillation power, and a noise index of the oscillator, respectively. The noise index indicates a magnitude of noise components occurring in the oscillator, attributed to transistors producing a thermal noise, resistor components, etc. Essentially, Fv depends on the number of transistors and the number of resistors in the circuit. For an oscillator installed within an integrated circuit, a channel thermal noise produced from the transistors is a major factor as a noise component which contributes to Fv.

Meanwhile, in A. Hajimiri and T. H. Lee, "A general theory of phase noise in electrical oscillators," IEEE J. solid-State Circuits, Vol. 33, pp. 179-194, phase noise modeling is performed utilizing an impulse sensitivity function ISF $\Gamma$, which is formulated in Equation (3).

$$\Gamma\{\omega_0 t\} = \frac{c_0}{2} + \sum_{n=1}^{\infty} c_n \cos(n\omega_0 t + \theta_n) \qquad (3)$$

The impulse sensitivity function ISF represents phase variations when an impulse current is injected at an oscillator terminal. In other words, phase variations are determined as an impulse response to current input.

As is expressed in Equation (3), the impulse sensitivity function ISF is expressed as a periodic function taking an oscillation frequency as a fundamental frequency and its general form is a first order differentiation of an oscillation voltage waveform. In Equation (3), C0 and Cn denote Fourier coefficients for Fourier series expansion of the impulse sensitivity function, where C0 is a DC component of the impulse sensitivity function and, as for Cn, n=1 denotes a fundamental component and n=2, 3 . . . denote second harmonic and third harmonic components, respectively. Since active elements such as MOSFETs and bipolar transistors generally have a nonlinear characteristic, distortion components such as the second harmonic and third harmonic components increase, as the amplitude of the oscillation voltage of the oscillator increases, with the result that the impulse sensitivity function Γ increases also.

Through the use of the impulse sensitivity function, phase noise power in a large signal model is formulated by the following Equation (4).

$$S(\Delta\omega) = 10\log\left(\frac{\frac{\overline{i_n^2}}{\Delta f}\sum_{n=0}^{\infty}c_n^2}{4q_{max}^2\Delta\omega^2}\right) \quad (4)$$

Here, qmax, in, and Cn denote a maximum accumulated charge quantity at an oscillator node, an injected noise current quantity, and a Fourier coefficient for Fourier series expansion of the impulse sensitivity function Γ.

The above qmax and in are parameters relating to Po and Fvf in Equation (2) and phase noise is improved if qmax is larger and in is smaller. Here, Cn is a coefficient that represents distortion components of an oscillation waveform. For an ideal sine wave without distortions, Cn is 0 when n>1. In an actual electronic oscillator, Cn is not 0 when n>1 under the influence of nonlinearity of transistors and other factors. From Equations (3) and (4), it is obvious that phase noise is improved if Cn is smaller, which means that the oscillation waveform is less distorted.

Equations (2), (3), and (4) imply that, in order to reduce phase noise, the following four elements are important: (1) an increase in the oscillation amplitude; (2) an increase in Q of the resonator, (3) reducing the noise factor attributed to the thermal noise of transistors and resistors; and (4) reducing distortion components of the oscillation waveform.

As will be discussed below, however, conventional oscillators including the examples described in Japanese Patent Application Laid-Open Publication No. 2004-260301 and Japanese Patent Application Laid-Open Publication No. 2004-023762 do not fully take account of reducing distortion components of the oscillation waveform.

FIG. 28 is a circuit diagram showing an example of a conventional LC cross coupled oscillator that is generally used as an LC oscillator. This oscillator is made up of a differential amplifier circuit consisting of Q1 and Q2 and a load consisting of an LC resonator. An output signal of the differential circuit is taken out from a drain terminal and its frequency is selected by the LC resonator having a resonance frequency adjusted to a desired oscillation frequency. After amplified, this output signal is input to a gate terminal of the other transistor. By repeating this operation, an oscillation at the desired frequency can be produced and maintained. A tail current source 11 connected to a common ground part of the differential amplifier circuit has an effect of reducing oscillation waveform distortions by keeping the amplitude of the oscillation signal constant during the oscillation operation.

Meanwhile, FIG. 29 is a circuit diagram showing an example of an oscillator in which the tail current source was removed from the LC cross coupled oscillator of FIG. 28 and a common ground point of the differential amplifier is directly coupled to a circuit ground. This oscillator configuration is free from a voltage drop by the tail current source and thus makes it possible to get a larger amplitude than the oscillator of FIG. 28. This oscillator also has an effect of reducing its noise factor because of the removal of transistor and resistor elements constituting the tail current source. Among the above-mentioned four elements for phase noise reduction, this oscillator thereby achieves the phase noise reducing effect in terms of (1) an increase in the oscillation amplitude and (3) reducing the noise sources.

However, the oscillator of FIG. 29 does not have a voltage amplitude adjusting function implemented by the tail current source. This poses a problem of a large harmonic distortion occurring in the oscillation voltage waveform. For this reason, among the above-mentioned four elements for phase noise reduction, the aspect of (1) an increase in the oscillation amplitude is improved, but the above distortion deteriorates the oscillation waveform in the aspect of (4). Consequently, the phase noise improving effect is limited.

Then, to consider phase noise deterioration relative to the harmonic distortion of the oscillator of FIG. 29, derivation of the above-mentioned ISF with regard to the oscillator of FIG. 29 is performed below. First, for an ideal LC cross coupled oscillator wherein only the oscillation frequency exists without harmonics, its ISF is derived.

VOP and VOM designated by 401, 402 in FIG. 30A are the waveforms of differential output voltages at the output terminals of the oscillator, respectively, which represent the waveforms normalized with an maximum amplitude value. When looking at a transistor Q1, VOP is a drain to source voltage and VOM is a gate to source voltage, thus VOP is the output voltage of the transistor. Reference numeral 406 in FIG. 30B denotes a curve of ISF at the drain output terminal of the transistor Q1. Here, a major source of producing noise in the oscillator of FIG. 29 is a channel thermal noise of transistors Q1, Q2. The channel thermal noise is formulated by the following Equation (5), which is modeled as a current source parallel connected between the drain and the source.

$$\overline{i_n}^2 = 4kT\gamma g_m \quad (5)$$

In Equation (5), K denotes a Boltzmann constant, T an absolute temperature, γ a channel thermal noise coefficient, and gm transconductance of the transistor Q1. Modifying Equation (5), using the gate to source voltage VOM, can drive the following Equation (6). VOP periodically varies over time, because VOP is the output voltage of the oscillator, as noted above.

$$\overline{i_n}^2(t) = 4kT\gamma(V_{OM}(t) - V_{th}) \quad (6)$$

As is expressed in Equation (6), as VOM periodically varies over time, the channel thermal noise current also varies periodically over time. Reference numeral 407 in FIG. 30C denotes a curve of variation of the channel thermal noise over time, which is normalized with noise power density at a peak. The channel thermal noise that is a major noise source in the oscillator of FIG. 29 periodically varies over time as shown in FIG. 30C. Hence, the ISF curve derived in FIG. 30B also needs to take such variation over time into account. Variation over time of the ISF curve is represented by multiplying the ISF curve in FIG. 30B and the normalized waveform of the channel thermal noise in FIG. 30C. Reference numeral 408 in FIG. 30D denotes a curve of ISF of the oscillator taking the above periodical variation over time into account.

Secondly, for a practical LC cross coupled oscillator wherein a harmonic signal with a frequency that is an integral multiple of the oscillation frequency exists, its ISF is derived. Here, only a second harmonic is taken into account to avoid complication of analysis. In FIG. 32A, VOP (401) and VOM (402) denote the waveforms of output voltages with a fundamental frequency at the differential output terminals of the oscillator, respectively. Additionally, a second harmonic output voltage waveform 403 is shown separately from these waveforms. Then, an explanation is provided for the reason why there is a relation as shown in FIG. 32A between the phase of the fundamental signal and the phase of the second harmonic. The second harmonic of the LC cross coupled oscillator shown in FIG. 29 appears to be a common mode signal at the differential output terminals. Here, the relation between the phase of the fundamental signal and the phase of the second harmonic can be derived as follows. When a sine wave oscillation voltage signal with an amplitude of $A_m$, an oscillation angular frequency of $w_0$, and an initial phase of 0° is input to the oscillator of FIG. 29, its output current is formulated by the following Equation (7).

$$I_d(t) = K\left(2A_m V_{OD}\sin(\omega_0 t) + \frac{A_m^2}{2}\sin\left(2\omega_0 t - \frac{\pi}{2}\right) + \frac{A_m^2}{2} + V_{OD}^2\right) \quad (7)$$

Here, $V_{OD}$ is an overdrive voltage of the transistor Q1.

As in Equation (7), it is evident that the second harmonic occurs in a voltage to current converted signal in the transistor Q1, because of nonlinearity of the transistor. The voltage to current converted current signal in the transistor Q1 is input to the LC resonator and converted into a voltage.

FIG. 31 shows a relation between impedance and phase of an LC resonator having one parallel resonance frequency. This graph indicates that the phase shift at the parallel resonance frequency, i.e., oscillation frequency is 0°, whereas the phase shift at the second harmonic is −90°. When the signal current expressed in Equation (7) is input to the above LC resonator, its output current is formulated by the following Equation (8).

$$V_{out}(t) = K\left(2R_{L1st} V_{OD} A_m \sin(\omega_0 t) - R_{L2nd}\frac{A_m^2}{2}\sin(2\omega_0 t) + \frac{A_m^2}{2} + V_{OD}^2\right) \quad (8)$$

Equation (8) implies that the phase of a fundamental wave after the fundamental voltage signal takes a round of feedback loop and the phase of the voltage signal of a second harmonic generated in a voltage to current converter are both 0°. In practice, however, as the second harmonic takes a loop through the voltage to current converter and the resonator again, the phase of the second harmonic in Equation (8) does not become 0° exactly. However, the gain of the second harmonic in one round of loop is sufficiently low as compared with the gain of the fundamental frequency signal in one round of loop. Thus, the phase of the second harmonic in a practical case does not much differ from the phase of the second harmonic expressed in Equation (8). It is therefore obvious that, for the LC cross coupled oscillator of FIG. 29, the relation between the phase of the fundamental signal and the phase of the second harmonic is as shown in FIG. 32A.

Reference numerals 404 and 405 in FIG. 32B correspond to the VOP and VOM voltage waveforms shown in FIG. 32A. However, in FIG. 32B, the fundamental signal and the second harmonic are not separated and the voltage waveforms are normalized with an maximum amplitude value. It is evident that these waveforms are distorted as compared with the ideal oscillator's oscillation voltage waveforms (VOP, VOM) shown in FIG. 30A. FIG. 32C shows a waveform 406 of ISF derived in the same procedure as for the above ideal oscillator. Likewise, FIG. 32D shows a normalized periodic waveform of a channel thermal noise (channel thermal noise current waveform) 407 and FIG. 33 shows ISF (channel thermal noise ISF) 408 taking a periodic variation of the channel thermal noise into account, respectively.

Then, for an ideal LC cross coupled oscillator and a practical LC cross coupled oscillator taking the influence of a second harmonic into account, Fourier series expansion of the ISF waveforms of the channel thermal noises was performed to derive Fourier coefficients. Table 1 lists the thus derived values of Fourier coefficients. The following resulting coefficient values were derived, assuming a ratio of 1:0.3 between the voltage amplitude of the fundamental wave and that of the second harmonic.

TABLE 1

Dependency of channel thermal noise ISF of a conventional cross-coupled oscillator on high frequency

|  | C0 | C1 | C2 | C3 | C4 |
| --- | --- | --- | --- | --- | --- |
| Fundamental wave only | 0 | 0.213 | 0.25 | 0.127 | 0 |
| Including second harmonic | 0.095 | 0.279 | 0.377 | 0.406 | 0.053 |

Table 1 elucidates that a conventionally configured LC cross coupled oscillator suffers from a channel thermal noise ISF deterioration due to distortion components of harmonics. Especially, because there occurs a C0 term that converts a low frequency noise into a phase noise, the influence of 1/f noise in which noise power density increases in inverse proportion to frequency strongly appears. Obviously, this causes a phase noise deterioration of the oscillator through consideration based on the phase noise model of Equation (3).

Therefore, for the LC cross coupled oscillator of the conventional example, it is difficult to achieve the phase noise reducing effect by increasing the oscillation voltage, as noted above, on account of a harmonic distortion appearing in the voltage waveform with an increase of the oscillation voltage of the oscillator.

A challenge of the present invention is to provide an oscillator and a communication system using the oscillator, in particular, an LC oscillator adapted to lessen phase noise deterioration due to harmonic distortions and increase the amplitude of oscillation, thereby having a favorable low phase noise characteristic.

A exemplary aspect of the present invention is set forth below. An oscillator of the present invention comprising at least one voltage to current converter converting a voltage into a current and at least one resonator, wherein the resonator including a pair of LC tanks, each of said LC tanks being formed of a capacitive element and an inductive element connected in parallel, wherein a feedback loop is formed such that an output terminal of the voltage to current converter is connected to the resonator and an output terminal of the resonator is connected to an input terminal of the voltage to current converter, wherein inductive elements constituting the pair of LC tanks constituting the resonator are mutually inductively coupled, wherein two capacitive elements constituting the pair of LC tanks have virtually equal capacitance values and two inductive elements have virtually equal self-inductances, and wherein a coefficient of mutual induction between the inductive elements is set to a predetermined value, based on a relation between the phase of a fundamental signal and the phase of a second harmonic generated from the oscillator.

According to an aspect of the present invention, the phase of a second harmonic voltage generated from the oscillator can be fixed to a phase in which the ISF of channel thermal noise becomes minimum. As a result, it is possible to reduce phase noise deterioration due to oscillation voltage waveform distortions and increase the amplitude of an oscillation voltage. It is thus possible to realize an oscillator having a low phase noise characteristic and a communication system using the oscillator.

DETAILED DESCRIPTION OF THE PREFERRED EMBODIMENTS

Figure 1:
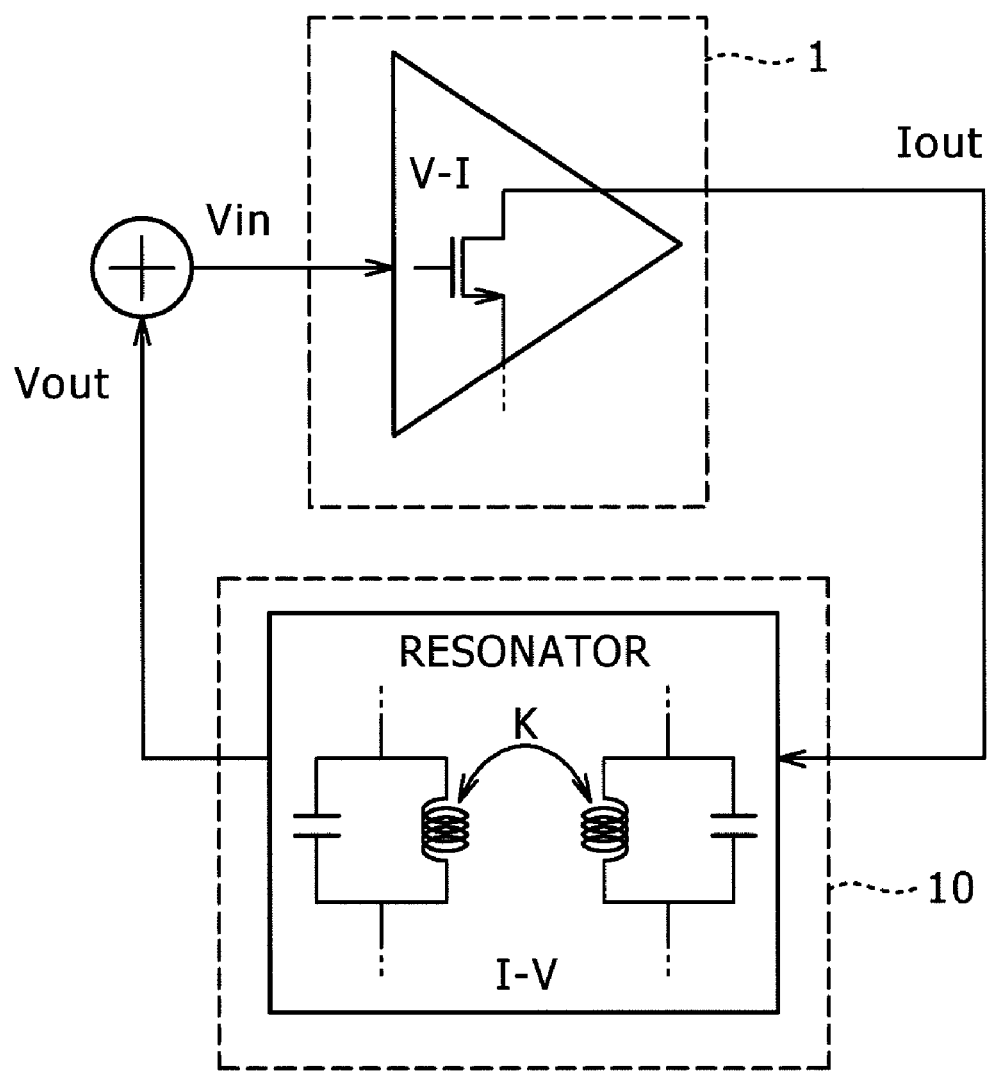
FIG. 1 is a circuit diagram depicting a concept of an oscillator pertaining to an embodiment of the present invention.

FIG. 1 is a circuit diagram depicting a concept of an oscillator pertaining to an embodiment of the present invention. The oscillator of the present invention comprises at least one (or more) voltage to current converter 1 formed of a transistor, and a resonator 10 consisting of a pair of LC tanks, each of which is formed of a capacitive element and an inductive element connected in parallel. An output terminal of the voltage to current converter 1 is connected to the resonator 10 where a current is converted to a voltage which is in turn output through a path that is connected to an input terminal of the voltage to current converter 1, so that a feedback loop is formed. The oscillator is characterized in that the inductive elements constituting the two LC tanks constituting the resonator 10 are mutually inductively coupled and a coefficient of mutual induction K between them is set to a predefined value, based on a relation between the phase of a fundamental signal and the phase of a second harmonic.

More specifically, the coefficient of mutual induction K is between approximately −0.5 and −0.8. That is, the resonator 10 has two parallel resonance frequencies and, if there is a relation that the coefficient of mutual induction K for the two inductive elements comprised in the resonator is −0.6 or a value (−0.5 to −0.8) around −0.6, a second higher parallel resonance frequency becomes greater than a first lower parallel resonance frequency by a factor of about 2, wherein the factor of about 2 is constant, independent of the inductance and capacitance values of the inductive elements and the capacitive elements comprised in the resonator. This principle will be described in greater detail in the section embodiment description. That is, the oscillator of the present invention including the above resonator, in a case where the first lower parallel resonance frequency of the resonator is set to be its oscillation frequency, is able to make the second parallel resonance frequency vertically equal to the frequency of the second harmonic that is generated from the oscillator. In other words, the oscillator is able to fix the phase of the second harmonic voltage to a phase in which the ISF of channel thermal noise becomes minimum.

In the following, preferred embodiments of the present invention will be described in detail with reference to the drawings.

Embodiment 1

Figure 2:
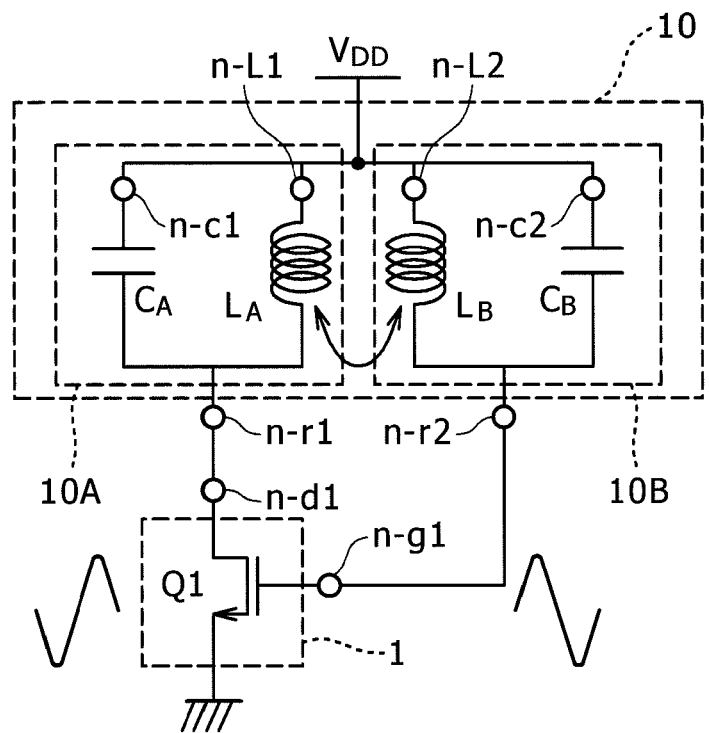
FIG. 2 is a circuit diagram showing a circuit configuration of an oscillator according to a first embodiment of the present invention.

An oscillator according to a first embodiment of the present invention is described, referring to FIG. 2 through FIG. 9. FIG. 2 is a diagram showing a circuit configuration of the oscillator according to the first embodiment. The oscillator of the first embodiment is made up of a voltage to current converter 1 formed of a transistor Q1 and a resonator 10 (10A, 10B). The voltage to current converter 1 has first and second terminals. The first terminal is an input terminal n-g1 for inputting an output voltage from a resonator B and the second terminal is an output terminal n-d1 for outputting a current signal after being voltage to current converted. A pair of resonators 10A, 10B is made up of capacitors C (CA, CB) and inductors L (LA, LB). Two capacitive elements (CA, CB) constituting the above-mentioned two LC tanks have virtually equal capacitance values and two inductive elements (LA, LB) both have their self-inductances which are vertically identical (this context is true for all other embodiments which will be described later). The inductive elements constituting the two LC tanks are mutually inductively coupled and a coefficient of mutual induction K between them is set to a predetermined value, based on a relation between the phase of a fundamental signal and the phase of a second harmonic. A range of the predetermined value and its reason will be detailed later.

Each resonator 10A, 10B has at least three terminals: first, second, and third terminals. In the first embodiment, the first terminal of the resonator 10A is an input terminal n-r1 for inputting an output current from the voltage to current converter 1 and its second and third terminals are AC grounded terminals for connection to a DC power supply for the resonator, a control voltage, etc., the second and third terminals including n-C1, n-L1. On the other hand, the first terminal of the resonator 10B is an output terminal n-r2 for connecting to the input terminal of the voltage to current converter to feed back a signal of only a particular frequency selected out of the signal current input from the first terminal n-r1 of the resonator 10A according to frequency characteristics of the resonator 10. Its second and third terminals are terminals for connection to the DC power supply for the resonator, the control voltage, etc., the second and third terminals including n-C2, n-L2. The inductors included in each resonator 10A, 10B are mutually inductively coupled and a coefficient of mutual reduction between them is about −0.6.

The oscillator of the present invention has a feedback loop in which a signal converted from a voltage to a current in the voltage to current converter 1 is output from its output terminal n-d1 which is connected to the input terminal n-r1 of the oscillator 10A and, after only a particular frequency is selected according to the frequency characteristics of the resonator, the signal of this particular frequency is fed back from the output terminal n-c2 of the resonator 10B to the input terminal n-g1 of the voltage to current converter 1.

In a case where the transistor Q1 constituting the voltage to current converter 1 is implemented by CMOS process, the output terminal of the voltage to current converter 1 becomes a drain terminal and its input terminal becomes a gate terminal.

Figure 3A:
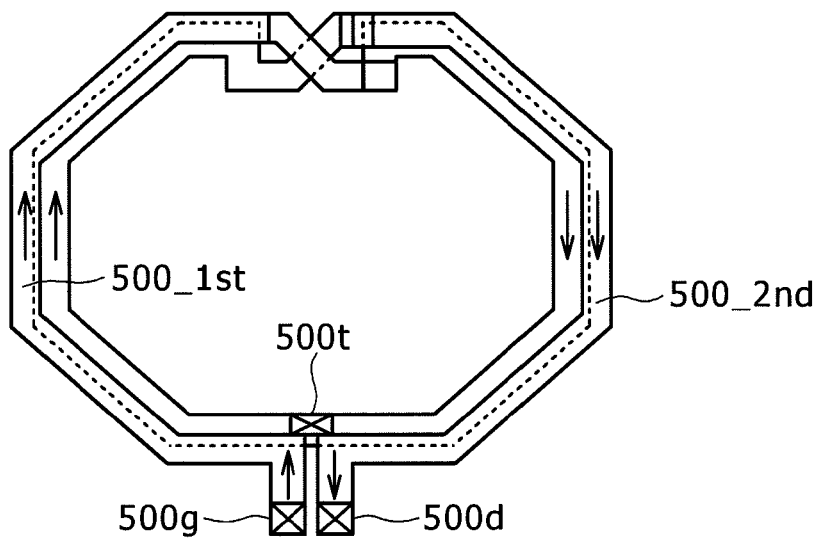
FIG. 3A is a diagram illustrating one example of mask layout of a resonator comprised in the oscillator according to the first embodiment.
Figure 3B:
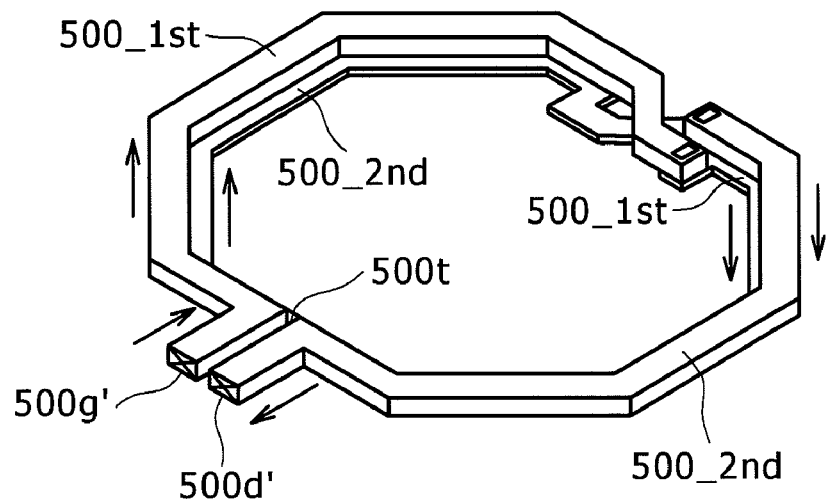
FIG. 3B is a perspective view of the mask layout of FIG. 3A.

The resonator 10 has two parallel resonance frequencies and the two inductors constituting the resonator are configured to have a relation that a coefficient of mutual induction K is set at or around −0.6. The above inductors mutually inductively coupled in a negative direction (K is set at or around −0.6) comprised in the oscillator of the first embodiment can be implemented by adopting a chip layout (mask layout) as is shown in FIG. 3 (FIG. 3A, FIG. 3B) in one example. FIG. 3B is a perspective view of FIG. 3A. In FIG. 3A, a terminal 500g (terminal 500g' in FIG. 3B) corresponds to the terminal n-r1 (or the terminal n-r2) of the resonator 10, a terminal 500d (terminal 500d' in FIG. 3B) corresponds to the terminal n-r2 (or the terminal n-r1) of the resonator 10, and a terminal 500t corresponds to n-L1, n-L2 of the resonator 10. As shown in FIG. 3, one inductor 500_1st resides in the resonator 10A and the other inductor 500-2nd resides in the resonator 10B. By laying two separate layers, one being a revolute turn wiring layer and the other being an involute turn wiring layer, one on top of another, it is possible to design the coefficient of mutual induction to be a desired value. That is, the inductor 500_1st is placed in the upper layer in the left part of the figure and in the lower layer in the right part, whereas the inductor 500_2nd is placed in the lower layer in the left part of the figure and in the upper layer in the right part, the upper and lower layers being inverted in the middle of the figure. In this way, by making a trans structure with two separate wiring layers so that the currents will flow in the same direction in the inductors, as indicated by arrows in the figure, it is possible to design the coefficient of mutual induction to be a desired value.

It is obvious that the inductance of each inductor is virtually identical, because the inductors 500_1st, 500_2nd residing in the resonator 10A and the resonator 10B, respectively, are symmetric with respect to the center line of the layout, as can be seen in the layout of FIG. 3.

Between the input terminals 500g, 500d of the resonator, for differential operation with respect to the fundamental signal, the currents flowing in the revolute turn 500_out and the involute turn 500_in flow in the same direction, thus increasing together the levels of the magnetic fields of the signals, so that a Q factor of the inductors can rise.

Figure 4:
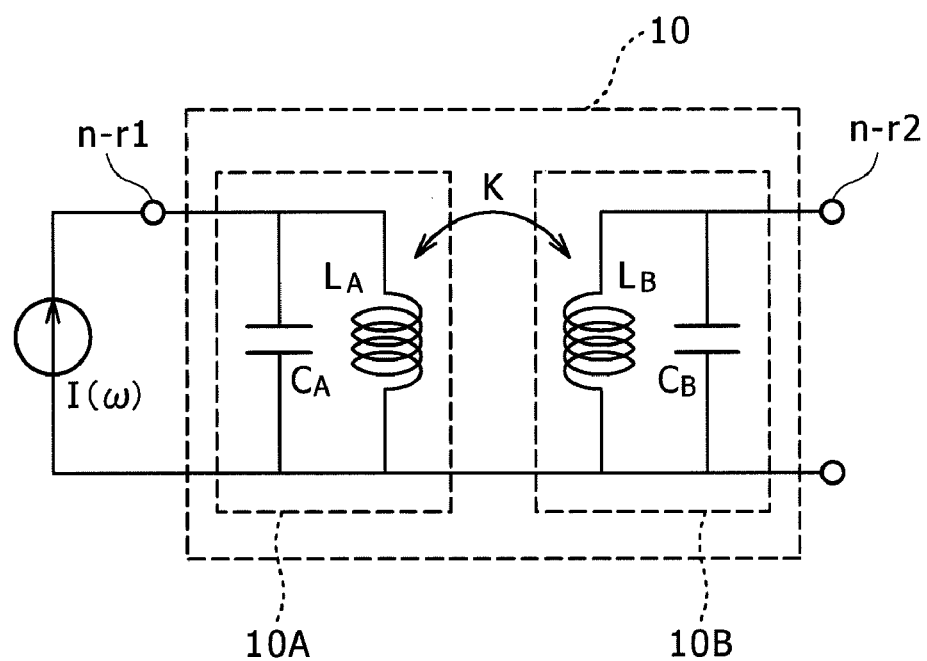
FIG. 4 is a verification circuit diagram to explain the principle of the resonator comprised in the oscillator according to the first embodiment.

An operating principle of the oscillator of the first embodiment is described in greater detail. FIG. 4 shows a verification circuit to explain the frequency characteristics of the resonator 10 included in the oscillator of FIG. 2. The verification circuit of FIG. 4 is configured by connecting an ideal AC current source for analysis to the input terminal n-r1 of the resonator 10. Now, let us obtain two parallel resonance frequencies from driving-point impedance at the input terminal n-r1 of the resonator 10 and transfer impedance at the output terminal n-r2. The following Equation (9) can be derived.

$$f_{osc,p1,p2} = \frac{1}{2\pi}\sqrt{\frac{(1 \pm K)}{CL(1-K^2)}} \quad (9)$$

From Equation (9), let us define a frequency ratio between the first parallel resonance frequency fosc, p1 and the second parallel resonance frequency fosc, p2 as R. R is formulated by the following Equation (10).

$$R = \sqrt{\frac{1-K}{1+K}} \quad (10)$$

Let us derive K for R=2 in Equation (10), i.e., to make the second higher parallel resonance frequency greater than the first lower parallel resonance frequency by a factor of just 2, which is a feature of the oscillator of the present invention. Then, K=±0.6 is obtained. That is, when the respective inductors LA and LB of the LC tanks 10A and 10B constituting the resonator 10 are mutually inductively coupled with a coefficient of mutual induction of ±0.6, the ratio between the first parallel resonance frequency fpr1 and the second parallel resonance frequency fpr2 is constantly 1:2, independent of the inductance and capacitance values of the inductors L (LA, LB) and the capacitors C (CA, CB) included in the resonator 10.

The independency of the inductance and capacitance values of the inductors L and the capacitors C is an important element. In a case where the oscillator of the first embodiment is configured to be operable as a voltage controlled oscillator VCO whose oscillation frequency can be changed by controlling the capacitance values of the capacitors C by a voltage, even if the oscillation frequency is changed, the ratio between the first parallel resonance frequency fpr1 and the second parallel resonance frequency fpr2 will be constantly 1:2, from the relation of Equation (10), independent of the inductance and capacitance values of the inductors L and the capacitors C included in the resonator 10.

Figure 5:
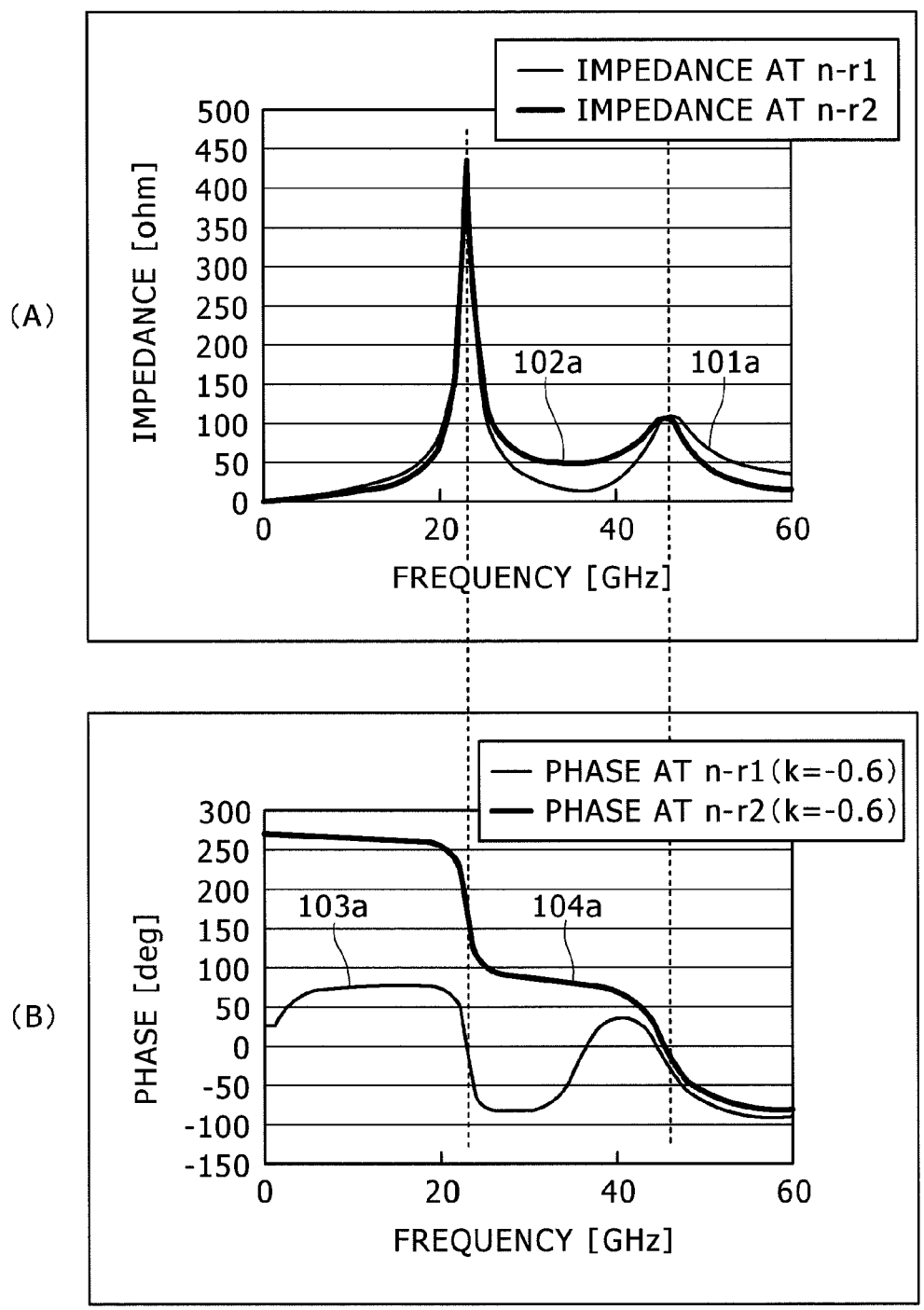
FIG. 5 shows graphs representing frequency characteristics of the resonator comprised in the oscillator according to the first embodiment, when K (a coefficient of mutual inductance) is equal to −0.6.
Figure 6A:
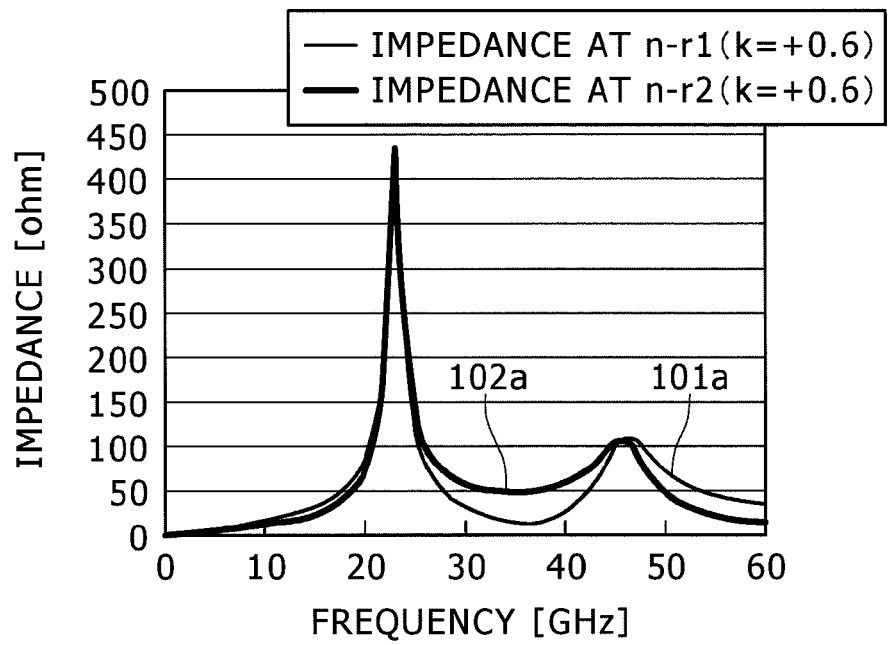
FIGS. 6A and 6B show graphs representing frequency characteristics of the resonator comprised in the oscillator according to the first embodiment, when K is equal to +0.6.
Figure 6B:
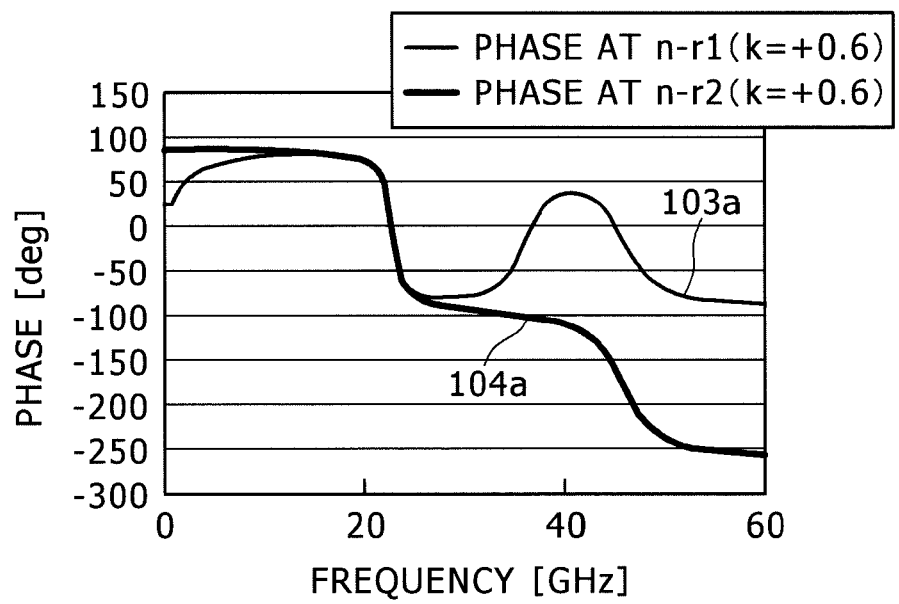

FIG. 5, FIGS. 6A and 6B show results of analysis performed using a circuit simulator, when assigning L=200 pH, C=150 fF, and K of +0.6 and −0.6 as examples of values for the verification circuit of FIG. 4. FIG. 5A represents impedance characteristics when K=−0.6 and FIG. 5B represents frequency characteristics of the phases when K=−0.6. Reference numeral 101a denotes transfer impedance at the terminal n-r2, reference numeral 102a denotes driving-point impedance at the terminal n-r1, reference numeral 103a denotes a phase characteristic at the terminal n-r2, and reference numeral 104a denotes a phase characteristic at the terminal n-r1, respectively. As can be seen in FIG. 5A, the first and second parallel resonance frequencies are 23 GHz and 46 GHz, respectively. That is, this graph implies that a result as formulated in Equation (10) is visually obtained, when K=−0.6.

FIG. 5B implies that the characteristics of the phases at the terminals n-r1 and n-r2 are such that a phase difference of 180° occurs at the first parallel resonance frequency (23 GHz) which becomes the oscillation frequency of the oscillator and the phases become in-phase at the second parallel resonance frequency (23 GHz) which corresponds to the second harmonic frequency of the oscillator. That is, the circuit of the first embodiment is able to generate a differential signal between the terminal n-r1 and the terminal n-r2 at the fundamental oscillation frequency without using a differential amplifier of a cross coupled type or the like. Moreover, this circuit enables yielding the first lower parallel resonance frequency as the oscillation frequency of the oscillator and making the second higher parallel resonance frequency equal to the second harmonic of the oscillator, which is a feature of the present invention.

On the other hand, FIG. 6A shows impedances and FIG. 6B shows frequency characteristics of the phases, when K=+0.6, as a comparison example. Reference numeral 101b denotes transfer impedance at the terminal n-r2, reference numeral 102b denotes driving-point impedance at the terminal n-r1, reference numeral 103b denotes a phase characteristic at the terminal n-r2, and reference numeral 104b denotes a phase characteristic at the terminal n-r1, respectively. As can be seen in FIG. 6A, the frequency characteristics of the impedances coincide with those when K=−0.6. However, as is evident from FIG. 6B, the frequency characteristics of the phases between the terminal n-r1 and the terminal n-r2 are opposite to those when K=−0.6; i.e., the phases become in-phase at the first parallel resonance frequency and a phase difference of 180° occurs at the second parallel resonance frequency.

The circuit of the first embodiment of the present invention needs to yield opposite-phase signals, that is, the signals having a phase difference of 180° at n-r1 and n-r2 at the oscillation frequency to satisfy oscillation conditions of the oscillator. In the case of the circuit of the comparison example (K=+0.6) corresponding to the first embodiment, this circuit does not satisfy the oscillation conditions at the first parallel resonance frequency. To the contrary, it performs an oscillation operation at the second parallel resonance frequency at which the phase difference of 180° occurs. However, if the second parallel resonance frequency is taken as the oscillation frequency of the oscillator, it is impossible to yield the first lower parallel resonance frequency as the oscillation frequency of the oscillator and make the second higher parallel resonance frequency equal to the second harmonic of the oscillator, which is a feature of the present invention, and the effect of the present invention cannot be achieved.

In other words, with regard to the resonator used in the oscillator of the present invention, it is a requirement that the coefficient of mutual induction K is negative, preferably, −0.6; in that case, the effect to a maximum extent can be achieved.

Then, ISF for the oscillator of the first embodiment is derived in the same manner as in the above-discussed conventional example. In the oscillator of FIG. 2, it is assumed that a voltage signal with an oscillation frequency VOP=$A_m$ sin $\omega_0 t$ is input to the input terminal n-g1 of the voltage to current converter 1. The voltage signal input to the voltage to current converter 1 is converted from the voltage to a current which is in turn output at the output terminal n-d1 of the voltage to current converter 1. The current signal is expressed as in the above Equation (7) as described previously and has a second harmonic frequency besides the fundamental frequency due to nonlinearity of the transistor Q1. The current signal output from the terminal n-d1 is input to the input terminal n-r1 of the resonator 10, converted to a voltage at the output terminal n-r2, and the voltage is fed back to the input terminal of the voltage to current converter 1.

As indicated by the curve of the phase characteristic 103 at the terminal n-r2 in FIG. 5, it turns out that the phase at the first parallel resonance frequency fpr1, i.e., the oscillation frequency and the phase shift at the second harmonic frequency are both 0°. The voltage signal fed back after taking one round through the feedback loop is formulated as in the following Equation (11).

$$V_{out}(t) = K\left(2R_{L1st}V_{OD}A_m\sin(\omega_0 t) + R_{L2nd}\frac{A_m^2}{2}\sin\left(2\omega_0 t - \frac{\pi}{2}\right) + \frac{A_m^2}{2} + V_{OD}^2\right) \quad (11)$$

A second harmonic generated during the first round of the loop is input to the terminal n-g1 of the voltage to current converter 1 and the second harmonic voltage signal $V_{out\_2}^{nd}$(t) at the terminal n-g1 fed back after taking one round through the loop again is formulated by the following Equation (12).

$$V_{out\_2nd}(t) = KV_{OD}R_{L2nd}^2 A_m^3 \sin\left(2\omega_0 t + \frac{\pi}{2}\right) \quad (12)$$

Figure 28:
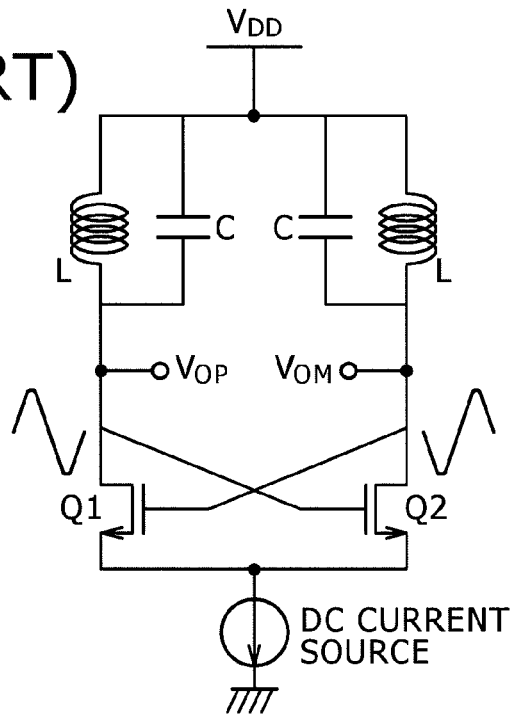
FIG. 28 is a circuit diagram showing a configuration example of a conventional oscillator.

Equations (11) and (12) imply that the phase of a second harmonic generated in the loop from the fundamental wave which has initially been input to the voltage to current converter 1 coincides with the phase of the signal having been input as the second harmonic to the voltage to current converter 1 and fed back after taking one round of the loop. Stated differently, the phase of the second harmonic of the oscillator in the conventional example of FIG. 28 becomes $2\omega_0 t + \pi/2$ and it turns out that the phase goes ahead by $\omega_0 t + \pi/2$ relative to the fundamental signal.

Figure 7A:
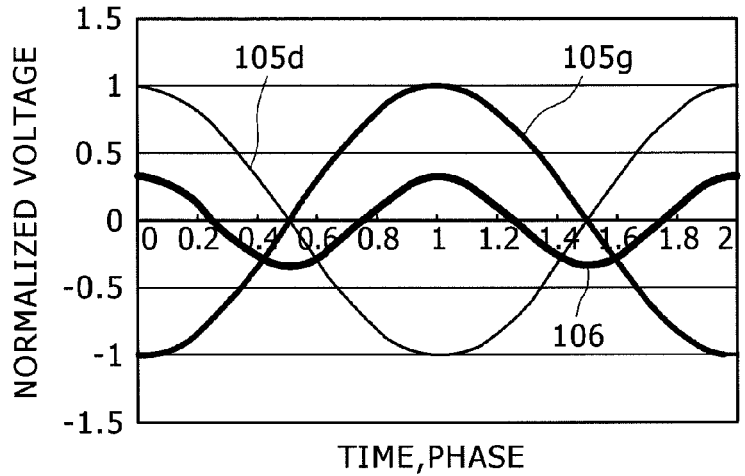
FIGS. 7A-7C show waveform diagrams representing the characteristics of voltage waveforms and related waveforms representing a relation between the phase of the fundamental wave and the phase of the second harmonic in the oscillator according to the first embodiment of the present invention.
Figure 7B:
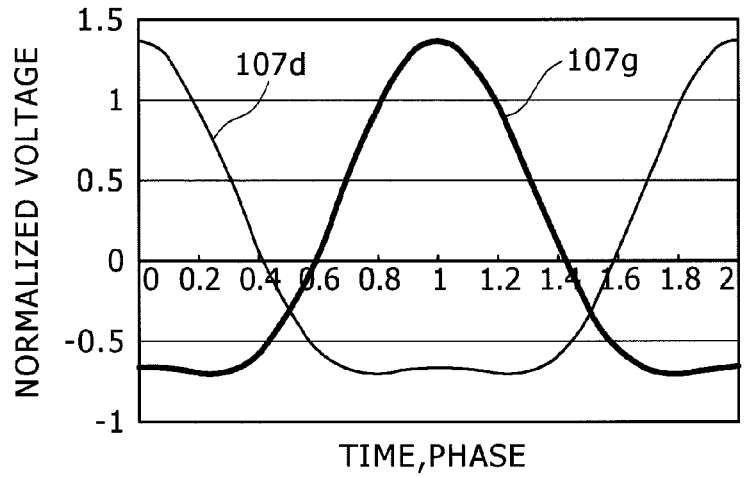
Figure 7C:
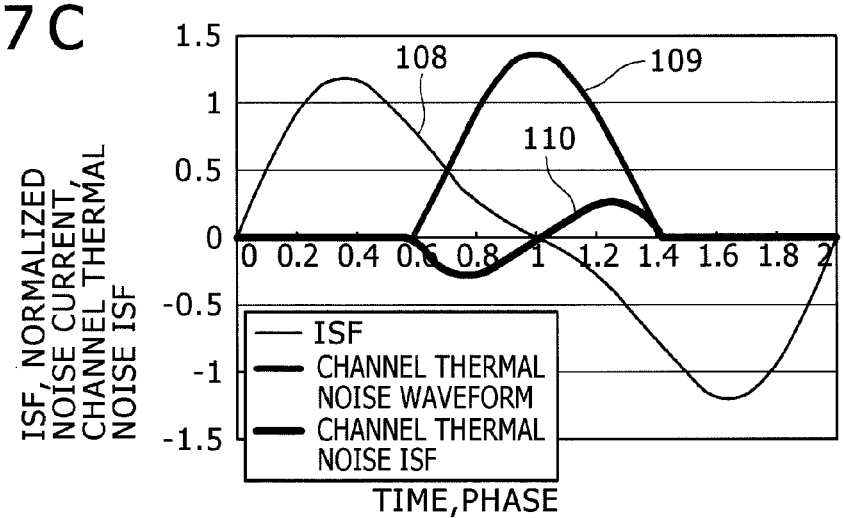

Using FIGS. 7A-7C, an explanation is provided for the characteristics of voltage waveforms and related waveforms representing a relation between the phase of the fundamental wave and the phase of the second harmonic in the oscillator according to the first embodiment of the present invention. FIG. 7A is a waveform diagram in which fundamental signal waveforms 105d, 105g and a second harmonic waveform 106 are separately shown, based on the relation between the phase of the fundamental wave and the phase of the second harmonic. The waveform 105d of the fundamental signal appears at the terminal n-d1 and the waveform 105g of the fundamental signal appears at the terminal n-g1 in the oscillator of FIG. 2 and the second harmonic waveform 106 appears to be an in-phase signal (common mode signal) for the terminals n-d1, n-g1. FIG. 7B is a waveform diagram in which the fundamental signal waveforms and the second harmonic waveform are not separated, i.e., they are combined. The waveform 107d appears at the terminal n-d1 and the waveform 107g appears at the terminal n-g1 in the oscillator of FIG. 2. FIG. 7C shows an ISF curve 108 derived in the same procedure for the conventionally configured oscillator. FIG. 7C also shows a normalized periodic waveform of channel thermal noise 109 and an ISF curve taking a periodic variation of the thermal channel noise into account 110 separately.

In FIG. 7C, owing to the facts that the peak of the ISF curve 108 coincides with the zero cross point of the channel thermal noise waveform 109 at a time t=1 and that the ISF curve 108 has an odd symmetric waveform characteristic and the channel thermal noise waveform 109 has an even symmetric waveform characteristic at the time t=1, it is possible to cancel out a DC component C0 of the channel thermal noise ISF 110 derived by multiplying the ISF curve 108 and the channel thermal noise waveform 109. As can be recognized by comparing this channel thermal noise waveform 109 to the channel thermal noise waveform of the conventional LC cross coupled oscillator, a time during which the channel thermal noise is produced in one cycle of period is decreased about 20%.

Fourier series expansion of the channel thermal noise ISF 110 of the oscillator of the first embodiment was performed to derive Fourier coefficients. Table 2 lists the thus derived values of Fourier coefficients. As is the case for the conventional example, the following resulting coefficient values were derived, assuming a ratio of 1:0.3 between the voltage amplitude of the fundamental wave and that of the second harmonic.

TABLE 2

Fourier coefficients of channel thermal noise
ISF of the oscillator of Embodiment 1

|  | C0 | C1 | C2 | C3 | C4 |
| --- | --- | --- | --- | --- | --- |
| Conventional example (ideal) | 0 | 0.213 | 0.25 | 0.127 | 0 |
| Conventional example | 0.095 | 0.279 | 0.377 | 0.406 | 0.053 |
| Embodiment 1 | 0 | 0.189 | 0.241 | 0.213 | 0.053 |

Table 2 elucidates that all Fourier coefficients of channel thermal noise ISF except for C4 are improved as compared with the conventional example, despite the fact that a distortion component attributed to the second harmonic exists, and that the LC oscillator of the first embodiment has a channel thermal noise ISF characteristic closer to an ideal LC cross coupled oscillator. Especially, because the coefficient C0 that converts a low frequency noise into a phase noise becomes 0, this implies a very low phase variation in terms of 1/f noise in which noise power density increases in inverse proportion to frequency.

Thus, the oscillator in the first embodiment of the present invention is able to regulate the phase of the second harmonic voltage generated from the oscillator to a phase in which the ISF of channel thermal noise becomes minimum. As a result, it is possible to reduce the phase noise deterioration due to oscillation voltage waveform distortions and increase the amplitude of the oscillation voltage. It is possible to realize an oscillator having a low phase noise characteristic and a communication system using the oscillator.

Figure 8A:
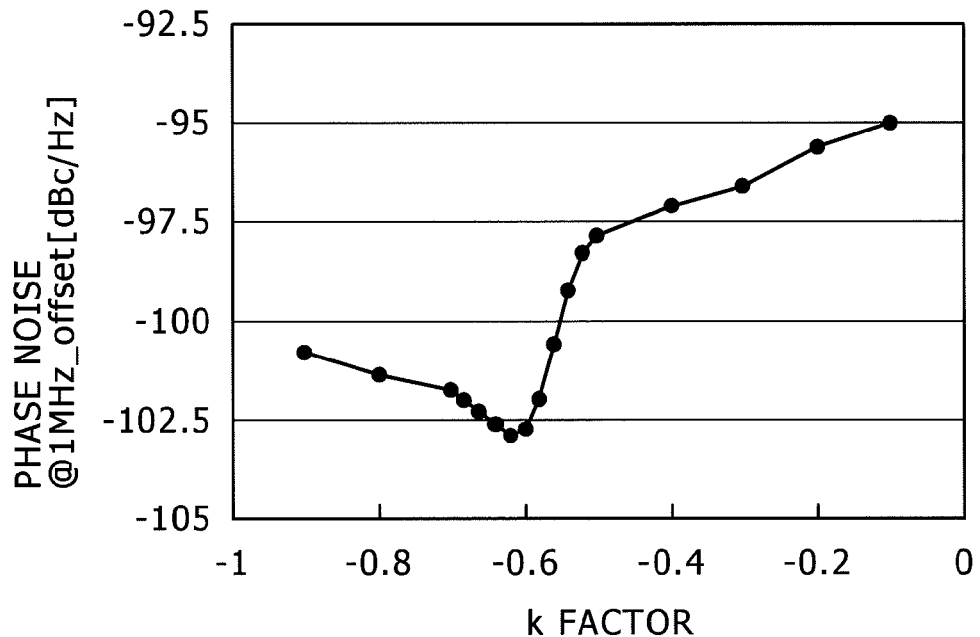
FIGS. 8A-8B show graphs, one representing a phase noise characteristic, when the factor of K is varied around −0.6; and the other representing a phase noise characteristic, when K is set to −0.6 and the ratio of the second resonance frequency to the fundamental frequency is set at 2:1 and smaller and greater than 2:1 in a resonator analogous to the resonator in the first embodiment.

Then, FIG. 8A shows a result of simulation of a phase noise at a 1 MHz offset using a circuit simulator, when the coefficient of mutual induction between resonator elements 13A, 13B of a resonator 13 in the oscillator according to the first embodiment of the present invention is varied in a range from −0.1 to −0.9. For the LC cross coupled oscillator of the conventional example, the factor of K is assumed to be 0. From the simulation result shown in FIG. 8A, it turns out that the phase noise of the oscillator according to the embodiment of the present invention is most improved, when the coefficient of mutual induction is −0.6, as designed theoretically. It also turns out that an improvement of about 5 dB can be achieved between −0.5 and −0.8, not only at −0.6, set for the coefficient of mutual induction. In other words, it is preferable to design the coefficient of mutual induction to be −0.6 theoretically, but a considerable degree of improvement can be achieved even if the above coefficient for actual products is slightly larger or smaller than −0.6, i.e., in a range of −0.5 to −0.8 due to manufacturing variation.

Figure 8B:
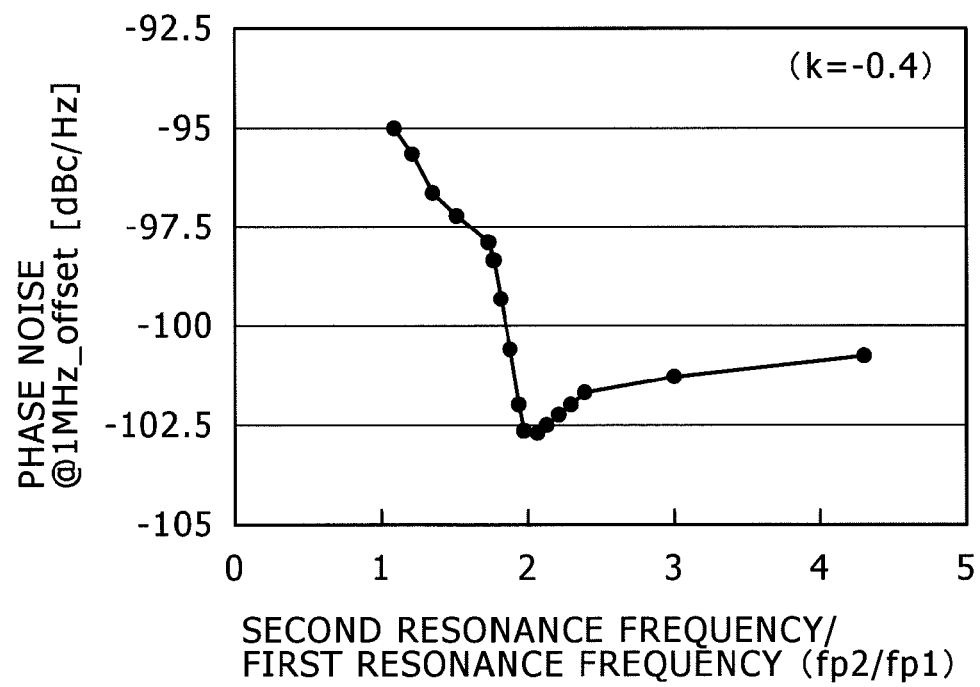

Then, FIG. 8B is a graph representing a phase noise characteristic, when K is set to −0.6 and the ratio of the second resonance frequency to the fundamental frequency is set at 2:1 and smaller and greater than 2:1. This graph indicates that the highest effect of phase noise improvement is attained when the ratio of the second resonance frequency to the first (fundamental) frequency is 2:1. A considerable degree of improvement can be achieved even when the ratio varies within a certain range around the ratio of 2:1, not only at 2:1, on account of the same reason as for the coefficient of mutual induction.

Figure 9:
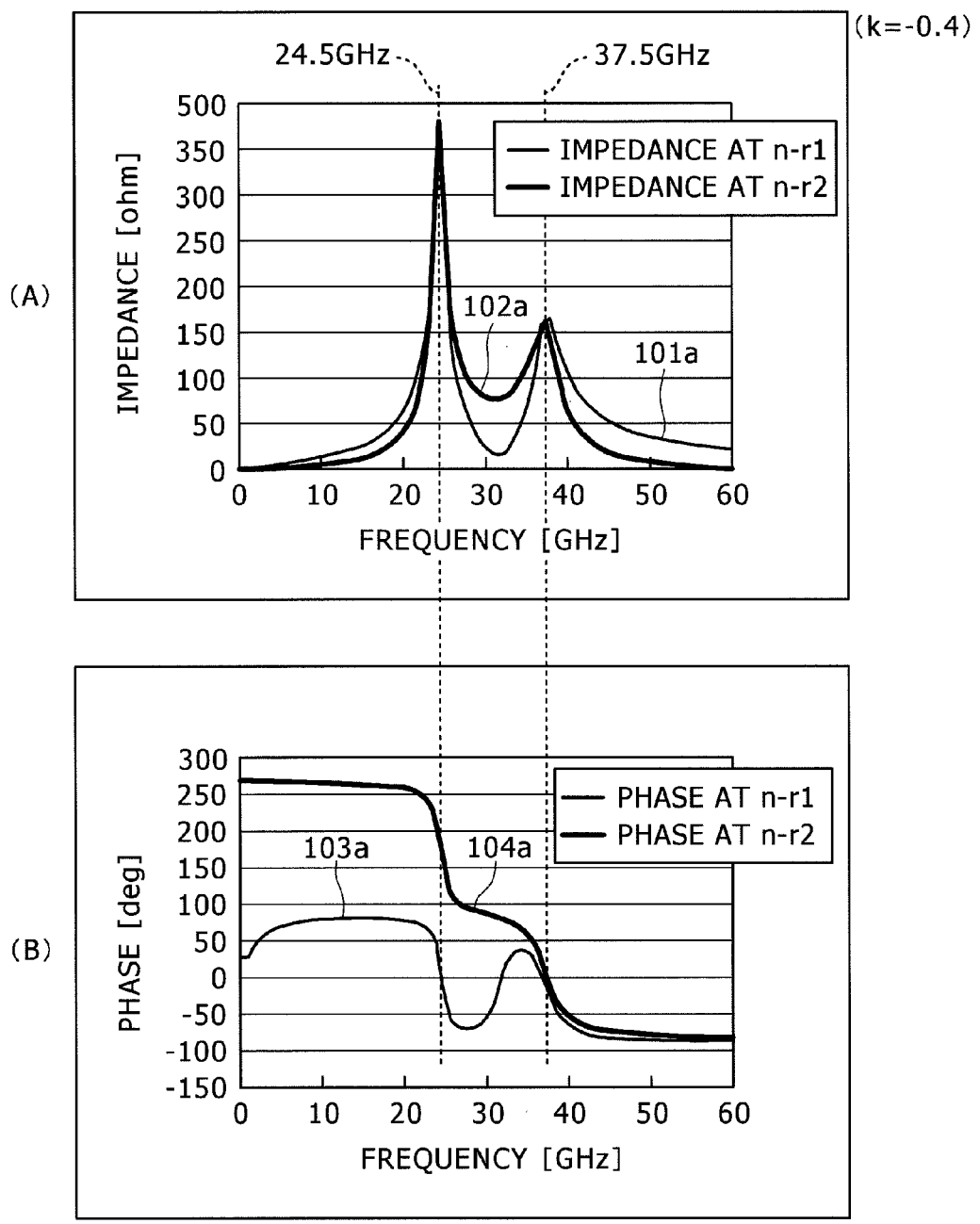
FIG. 9 shows graphs representing frequency characteristics, when K is set to −0.4 in a resonator analogous to the resonator in the first embodiment.

FIG. 9 shows graphs representing frequency characteristics obtained using the circuit simulator, when K is set to −0.4 in a resonator analogous to the resonator in the first embodiment of the present invention as a comparison example. FIG. 9A shows impedance characteristics and FIG. 9B shows frequency characteristics of the phases. As can be seen in FIG. 9A and FIG. 9B, the first and second parallel resonance frequencies are 24.5 GHz and 37.5 GHz, respectively. It thus turns out that, when K=−0.4, such an effect is not achievable that the oscillation frequency is set greater than the fundamental frequency by a factor of 2 or around 2.

According to the first embodiment, the phase of the second harmonic voltage generated from the oscillator can be fixed to a phase in which the ISF of channel thermal noise becomes minimum. As a result, it is possible to reduce the phase noise deterioration due to oscillation voltage waveform distortions and increase the amplitude of the oscillation voltage. It is thus possible to realize an oscillator having a low phase noise characteristic.

The inductors mutually inductively coupled in a negative direction, comprised in the oscillator of the first embodiment, are able to increase the Q factor of the inductors, because the currents flow in the same direction in the inductors, thus increasing together the levels of the magnetic fields of the signals. Furthermore, in the layout of the resonator in the first embodiment, two inductors can be installed in an area occupied by one spiral inductor. Consequently, cost reduction is also feasible due to chip area shrinkage.

Embodiment 2

A second embodiment of the present invention relates to a push-push type oscillator to which the oscillator of the first embodiment of the invention is applied. The second embodiment is described below. The push-push type oscillator is an oscillator of a type that brings out a second harmonic of the oscillator as its output signal. As a conventional example, an example of such a push-push type oscillator is described in P. C. Huang, "A 131 GHz Push-Push VCO in 90-nm CMOS Technology", IEEE RFIC, 2005. To output a second harmonic positively, the push-push type oscillator needs to distort the signal waveform largely, that is, yield a large harmonic signal. However, as noted above, in the cross coupled oscillator of the conventional example, a large harmonic signal results in the channel thermal noise ISF that causes adverse effect on the phase noise characteristic. For this reason, generally, the phase noise characteristic of a push-push type oscillator is bad. However, the oscillator of the first embodiment allows for enlarging the amplitude of the second harmonic voltage, because a parallel resonance point is at a frequency that is just double the oscillation frequency, that is, the frequency corresponding to the second harmonic. Moreover, the oscillator of the first embodiment have a low sensitivity for phase noise deterioration due to the second harmonic. Therefore, a push-push type oscillator having a good phase noise characteristic can be realized.

Figure 10:
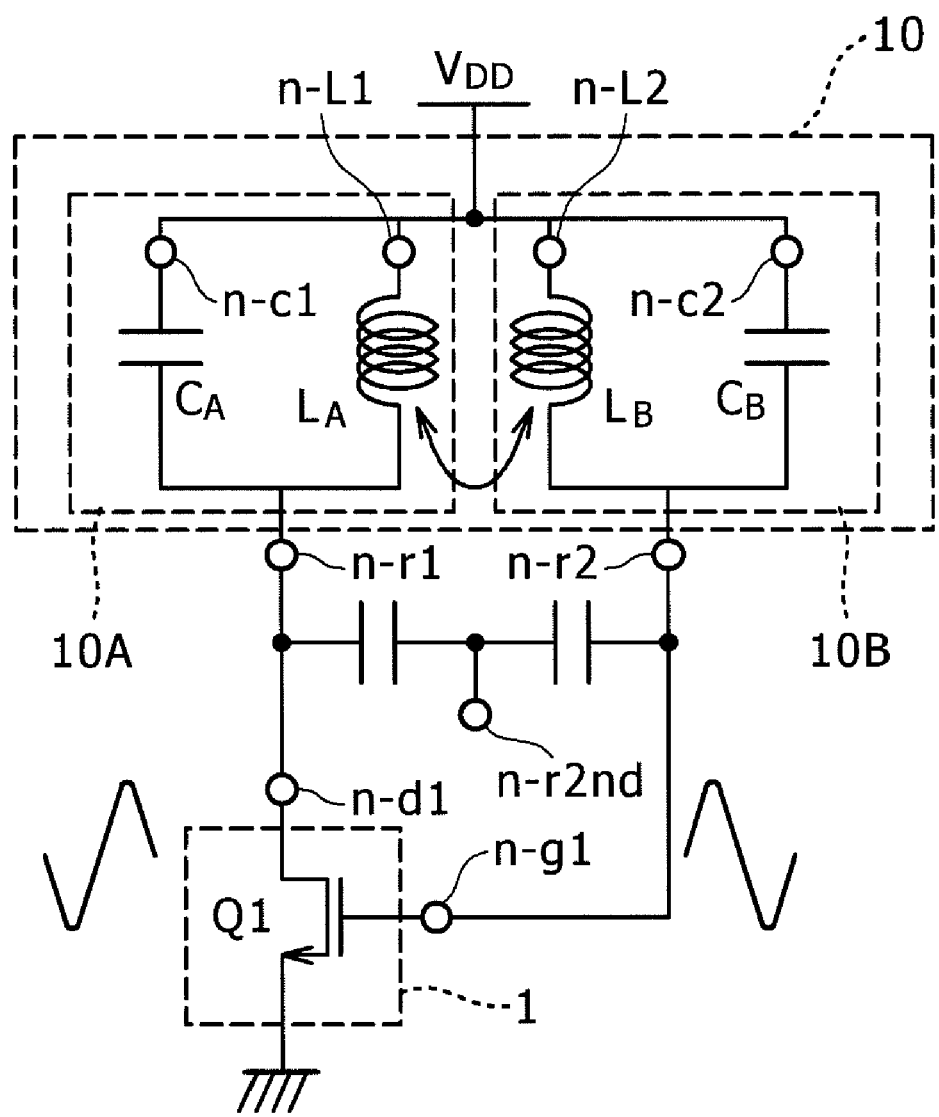
FIG. 10 is a circuit diagram showing a circuit configuration of an oscillator according to a second embodiment of the present invention.

FIG. 10 shows an example of a push-push type oscillator to which the oscillator of the first embodiment of the invention is applied. Two capacitors 301 are further connected to the input and output terminals n-r1 and n-r2 of the resonator 10 in the oscillator of FIG. 2. By drawing a signal from a middle point n-r2nd between the capacitors, it is possible to cancel out the fundamental signal and bring out only the second harmonic. Accordingly, the phase noise characteristic can be improved even for the push-push type oscillator in the same way as for the first embodiment.

Embodiment 3

Figure 11:
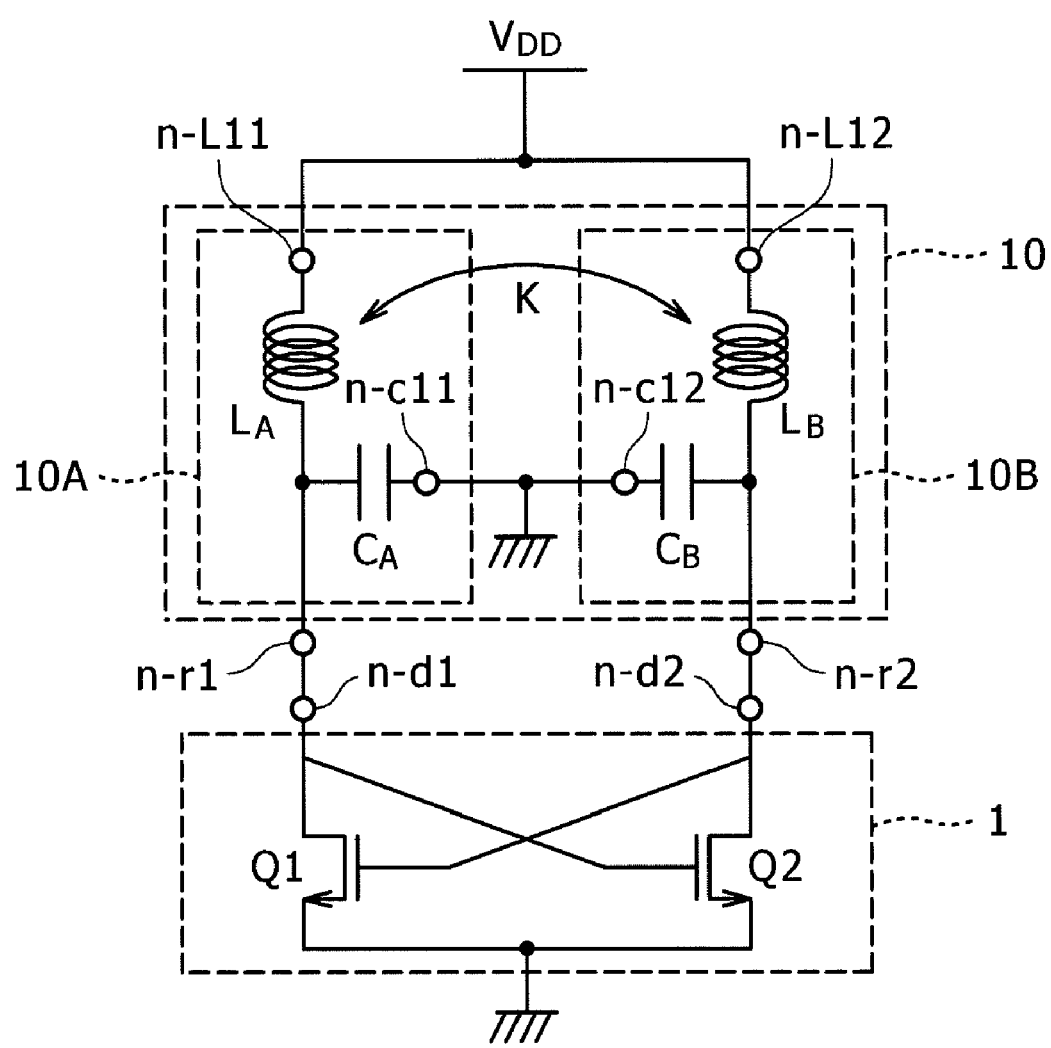
FIG. 11 is a circuit diagram showing a circuit configuration of an oscillator according to a third embodiment of the present invention.

An oscillator according to a third embodiment of the present invention is described, referring to FIG. 11 through FIG. 15. FIG. 11 shows a diagram showing a circuit configuration of the oscillator according to the third embodiment of the invention. The oscillator of the third embodiment is made up of a voltage to current converter 1 formed of transistors Q1, Q2 grounded to a common ground and a resonator 10 (10A, 10B).

The voltage to current converter 1 has first and second terminals. The first terminal is a terminal n-d2 serving as both an input terminal for inputting an output voltage from a resonator 10B and an output terminal for outputting a current signal after being voltage to current converted in the transistor Q2. The second terminal is a terminal n-d1 serving as both an input terminal for inputting an output voltage from a resonator 10A and an output terminal for outputting a current signal after being voltage to current converted. A pair of resonators 10A, 10B is made up of capacitors C and inductors L. Each resonator 10A, 10B has at least three terminals: first, second, and third terminals.

In the third embodiment, the first terminal of the resonator 10A is an input terminal n-r1 for inputting an output current from the voltage to current converter 1 and connecting to the input terminal of the voltage to current converter to feed back a signal of only a particular frequency selected according to frequency characteristics of the resonator 10. The second and third terminals of the resonator 10A are AC grounded terminals for connection to a DC power supply for the resonator, a control voltage, etc., the second and third terminals including n-C11, n-L11. On the other hand, the first terminal of the resonator 10B is an input terminal n-r2 for inputting an output current from the voltage to current converter 1 and connecting to the input terminal of the voltage to current converter to feed back a signal of only a particular frequency selected according to frequency characteristics of the resonator 10. The second and third terminals of the resonator 10B are terminals for connection to the DC power supply for the resonator, the control voltage, etc., the second and third terminals including n-C12, n-L12. The inductors included in the resonators 10A, 10B are mutually inductively coupled and a coefficient of mutual reduction between them is about −0.6.

The oscillator of the present invention has a feedback loop, as will be described below. The voltage to current converter 1 converts a voltage signal input from its input terminal n-d2 (or n-d1) into a current which is in turn output from its output terminal n-d1 (or n-d2) connected to the input terminal n-r1 (or n-r2) of the resonator 10A (or 10B). The resonator selects only a particular frequency according to its frequency characteristics and converts the current into a voltage which is in turn fed back to the input terminal n-d1 (or n-d2) of the voltage to current converter 1. In the oscillator of the third embodiment, the transistors Q1 and Q2 constituting the voltage to current converter 1 are cross coupled. Due to this, at output terminals n-d1, n-d2, output voltage signals with a fundamental frequency and odd harmonics behave as differential signals and output voltage signals with even harmonics such as a second harmonic become common mode signals.

In a case where the transistors Q1, Q2 constituting the voltage to current converter 1 are implemented by CMOS process, the terminal n-d1 of the voltage to current converter 1 becomes a drain terminal of Q1 and a gate terminal of Q2 and its terminal n-d2 becomes a gate terminal of Q1 and a drain terminal of Q2.

The inductors mutually inductively coupled in a negative direction, comprised in the oscillator of the third embodiment, can be implemented by adopting a chip layout as shown in FIG. 3A and FIG. 3B, as is the case for the first embodiment.

An operating principle of the oscillator of the third embodiment is described in greater detail. FIG. 12A through FIG. 12D illustrate a verification circuit to explain frequency characteristics of the resonator 10 comprised in the oscillator of FIG. 11. The verification circuit shown in FIG. 12A through FIG. 12D is configured by connecting an AC current source 200 which is ideal for analysis to one input/output terminal n-r1 of the resonator 10 and connecting an AC current source 201 which is ideal for analysis, having an opposite or common phase to the phase of the current source 200, to the other input/output terminal n-r2 of the resonator 10. A resonator 11 shown in FIG. 12B is a verification circuit for the resonator 10. The resonator 11 includes a mutual inductor KL making an equivalent transformation of the mutual coupling between the inductors L of the resonator elements 10A and 10B constituting the resonator in FIG. 12A.

Figure 12A:
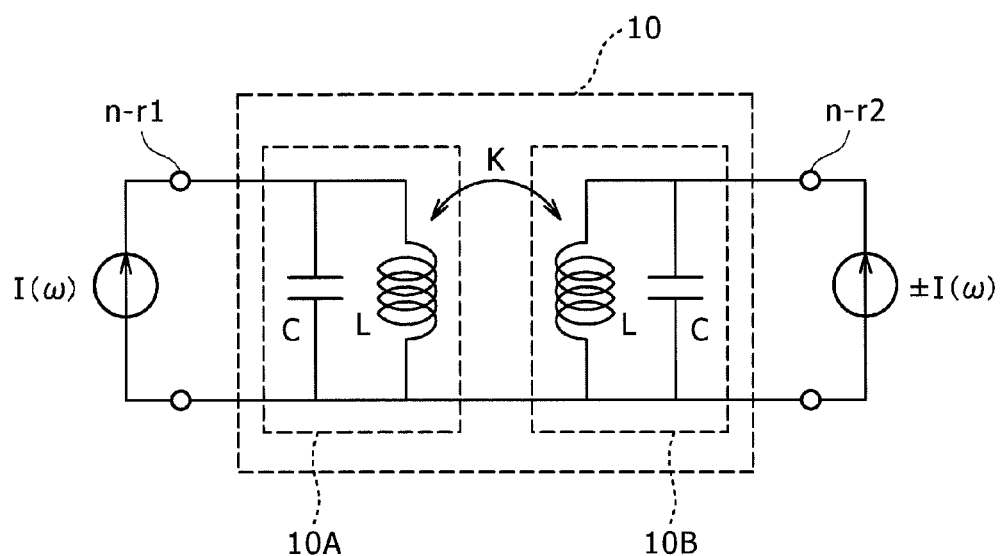
FIG. 12A is a first circuit diagram of a verification circuit to explain a principle of a resonator comprised in the oscillator according to the third embodiment of the invention.
Figure 12B:
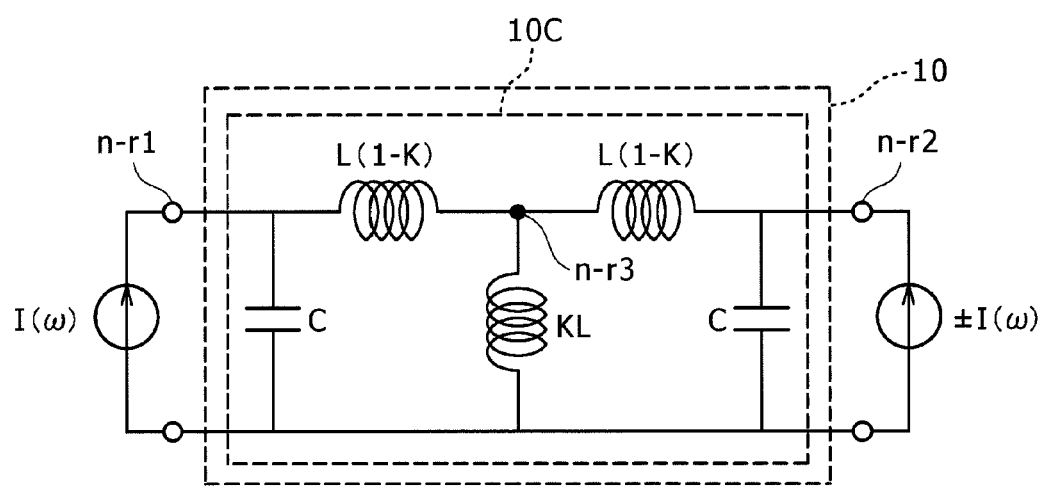
FIG. 12B is a second circuit diagram of a verification circuit to explain the principle of the resonator comprised in the oscillator according to the third embodiment of the invention.
Figure 12C:
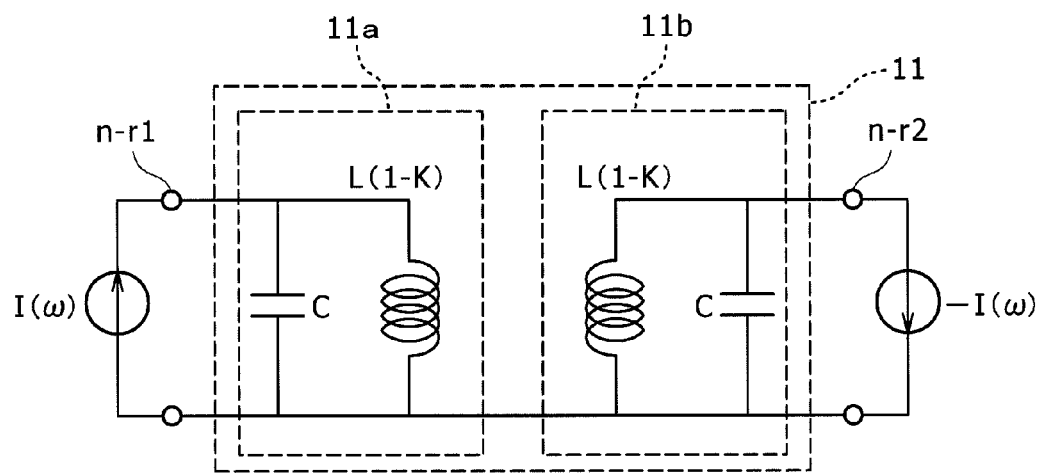
FIG. 12C is a third circuit diagram of a verification circuit to explain the principle of the resonator comprised in the oscillator according to the third embodiment of the invention.

First, when mutually differential AC currents are input to the terminals n-r1, n-r2 of the resonator of FIG. 12B, that is, odd harmonics including a fundamental wave are input, a terminal n-r3 inside the resonator behaves as a virtual ground point and, hence, the resonator 10c of FIG. 12B can be transformed into a resonator 11 consisting of resonator elements (11a, 11b) consisting of a pair of capacitors C and inductors L (1−K) shown in FIG. 12C. A resonance frequency $f_{RS,DIFF}$ of the resonator 11 consisting of resonator elements (11a, 11b) shown in FIG. 12C can be formulated by the following Equation 13 (13). In other words, the oscillation frequency of the oscillator of the second embodiment is formulated by Equation (13).

$$f_{RS,DIFF} = \frac{1}{2\pi\sqrt{L(1-K)C}} \quad (13)$$

Figure 12D:
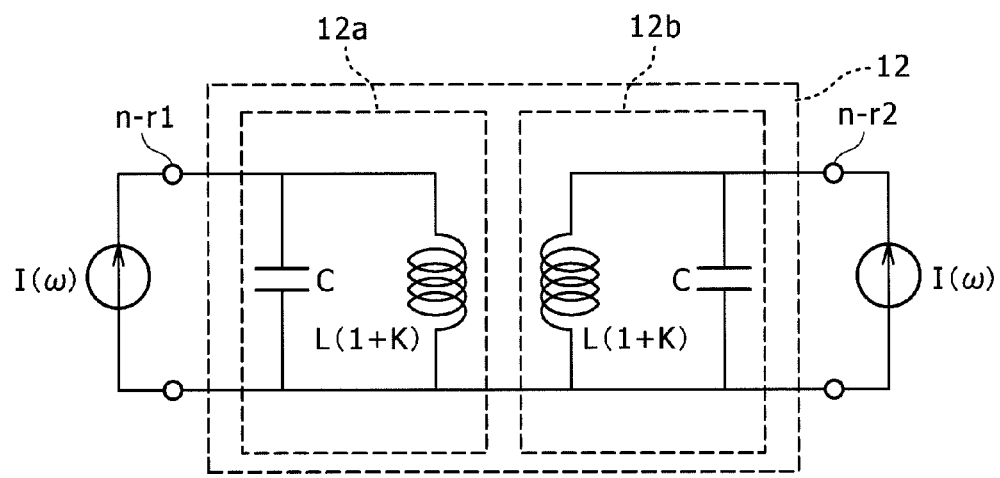
FIG. 12D is a fourth circuit diagram of a verification circuit to explain the principle of the resonator comprised in the oscillator according to the third embodiment of the invention.

Secondly, when mutually in-phase AC currents are input to the terminals n-r1, n-r2 of the resonator of FIG. 12B, that is, even harmonics including a second harmonic are input, the sum of the currents input from both AC current sources flow into the mutual inductor KL inside the resonator 10 according to Kirchhoff's current law. This can seem equivalent to current from one AC current source flowing into the inductor having double inductance 2KL. The resonator 10c of FIG. 12B can be transformed into a resonator 12 (12a, 12b) consisting of a pair of capacitors C and inductors L (1+K) shown in FIG. 12D. A resonance frequency $f_{RS,COM}$ of the resonator 12 consisting of resonator elements (12a, 12b) shown in FIG. 12D is formulated by the following Equation (14).

$$f_{RS,COM} = \frac{1}{2\pi\sqrt{L(1+K)C}} \quad (14)$$

Let us define a frequency ratio between a parallel resonance frequency $f_{RS,DIFF}$ when differential currents flows in, which can be obtained from Equation (13), and a parallel resonance frequency $f_{RS,COM}$ when common mode currents flow in, which can be obtained from Equation (14), as $R_2$. $R_2$ is formulated by the following Equation (15) which is the same as Equation (9) for the first embodiment.

$$R_2 = \sqrt{\frac{1-K}{1+K}} \quad (15)$$

As in the first embodiment, let us obtain $R_2$ by assigning K=−0.6 in Equation (15); then $R_2$=2 is derived. LC tank 10A and LC tank 10B constituting the resonator 10. That is, when the respective inductors L of the LC tanks 10A and 10B constituting the resonator 10 are mutually inductively coupled with a coefficient of mutual induction of −0.6, the ratio between the parallel resonance frequency $f_{RS,DIFF}$ when differential currents are input and the parallel resonance frequency $f_{RS,COM}$ when common mode currents are input is constantly 1:2, independent of the inductance and capacitance values of the inductors L and the capacitors C included in the resonator 10. This means that, when the parallel resonance frequency of differential signals is taken as the oscillation frequency of the oscillator, the parallel resonance frequency $f_{RS,COM}$ of common mode signals coincides with the second harmonic passing as common mode signals via the terminals n-d1, n-d2 of the oscillator of the second embodiment. As in the first embodiment, the independency of the inductance and capacitance values of the inductors L and the capacitors C is an important element. In a case where the oscillator of the third embodiment is configured to be operable as a VCO whose oscillation frequency can be changed by controlling the capacitance values of the capacitors C by a voltage, even if the oscillation frequency is changed, the ratio between the parallel resonance frequency $f_{RS,DIFF}$ for differential signals and the parallel resonance frequency $f_{RS,COM}$ for common mode signals is constantly 1:2, from the relation of Equation (15), independent of the inductance and capacitance values of the inductors L and the capacitors C included in the resonator 10.

Figure 13:
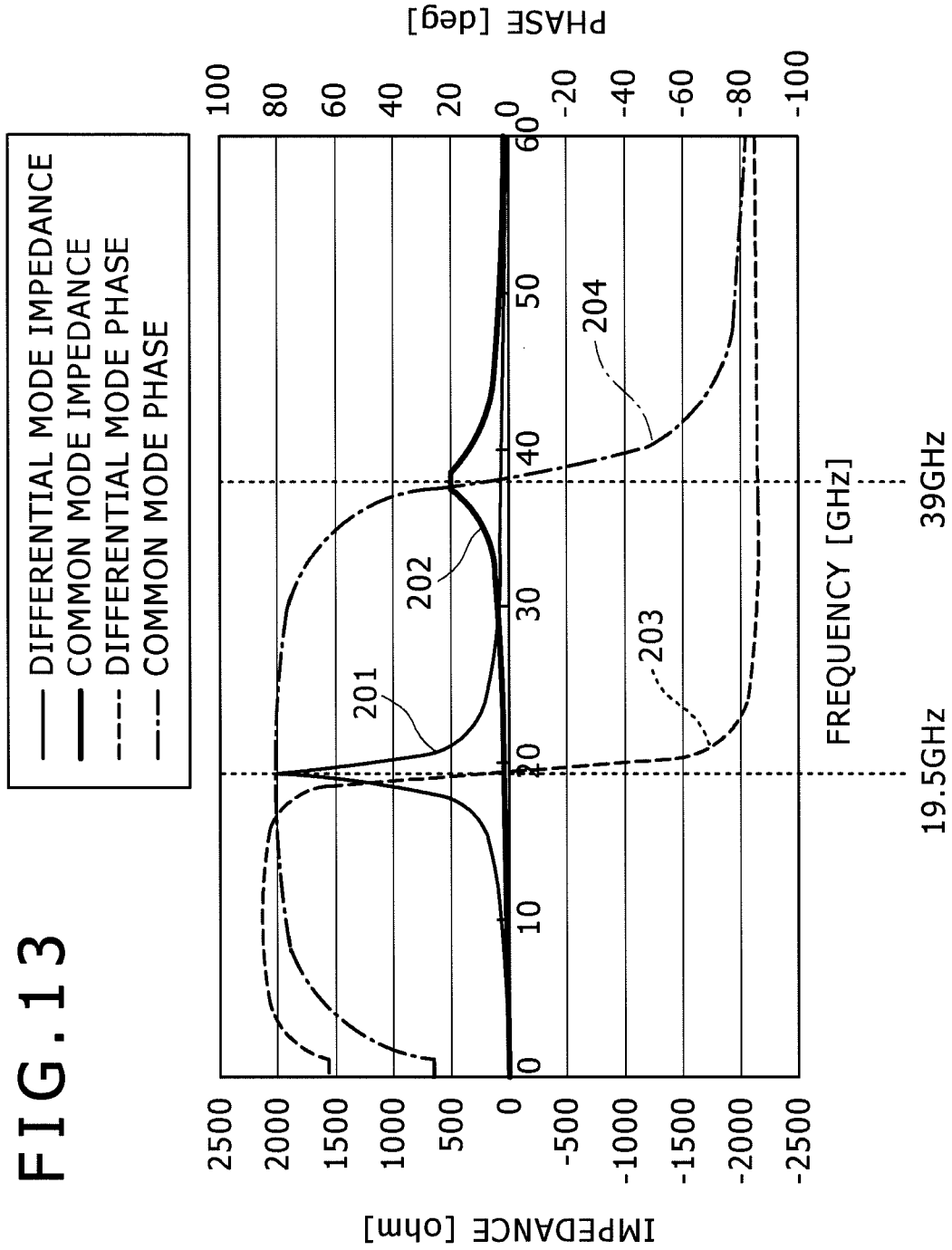
FIG. 13 shows a graph representing frequency characteristics of the resonator comprised in the oscillator according to the third embodiment of the invention.

FIG. 13 shows a result of analysis performed for one example of verification circuit of FIG. 12A using the circuit simulator. Reference numeral 201 denotes driving-point impedance at the terminal n-r1 for differential signals, reference numeral 202 denotes driving-point impedance at the terminal n-r1 for common mode signals, reference numeral 203 denotes a phase characteristic at the terminal n-r2 for differential signals, and reference numeral 204 denotes a phase characteristic at the terminal n-r1 for common mode signals, respectively. When C=80 fF, L=0.5 nH, the first and second parallel resonance frequencies are 19.5 GHz and 39.5 GHz, respectively. In other words, the oscillation frequency is double the fundamental frequency. That is, this graph implies that a result as formulated in Equation (15) is visually obtained.

Since the oscillator of the third embodiment has the resonator characteristics and conversion characteristics of the voltage to current converter 1 which are the same as in the first embodiment, the voltage amplitude waveforms, ISF curves, channel thermal noise waveforms, and channel thermal noise ISF curves of the fundamental oscillation signal and the second harmonic signal at the terminals n-r1, n-r2 correspond to the characteristics as shown in FIG. 7A to FIG. 7C.

Thus, the oscillator in the third embodiment of the present invention is able to regulate the phase of the second harmonic voltage generated from the oscillator to a phase in which the ISF of channel thermal noise becomes minimum. As a result, it is possible to reduce the phase noise deterioration due to oscillation voltage waveform distortions and increase the amplitude of the oscillation voltage. It is possible to realize an oscillator having a low phase noise characteristic and a communication system using the oscillator.

Figure 14A:
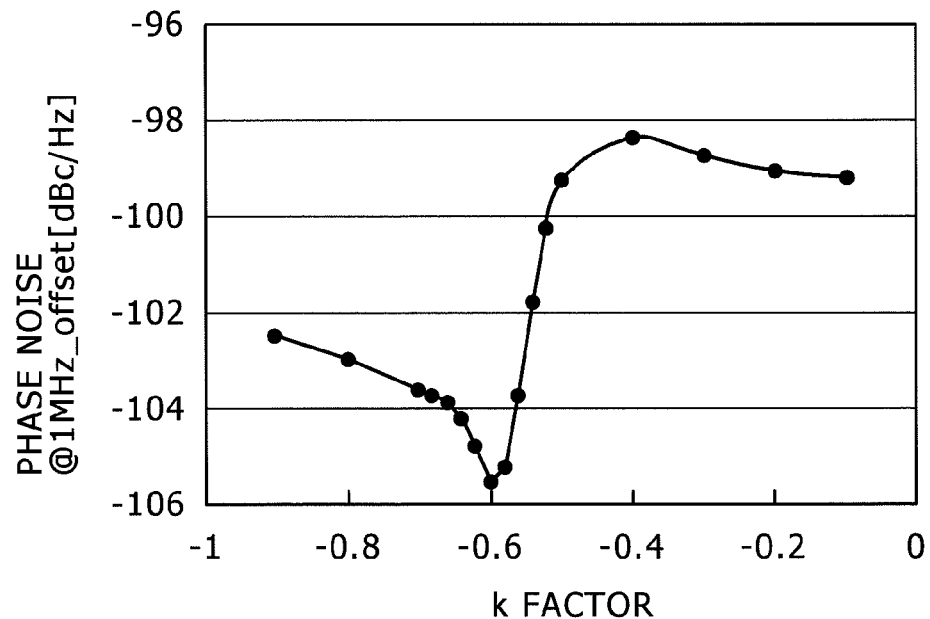
FIGS. 14A-14B show graphs, one representing a phase noise characteristic, when the coefficient of mutual induction K is varied from −0.1 to −0.9; and the other representing a phase noise characteristic, when K is set to −0.6 and the ratio of the second resonance frequency to the fundamental frequency is set at 2:1 and smaller and greater than 2:1 in a resonator analogous to the resonator in the third embodiment.

FIG. 14A shows a result of simulation of a phase noise at a 1 MHz offset using the circuit simulator, when the coefficient of mutual induction between resonator elements 13A, 13B of a resonator 13 in the oscillator according to the third embodiment of the present invention is varied in a range from −0.1 to −0.9. For the LC cross coupled oscillator of the conventional example, the factor of K is assumed to be 0. From the simulation result shown in FIG. 14A, it turns out that the phase noise of the oscillator according to the third embodiment of the present invention is most improved, when the coefficient of mutual induction is −0.6, as designed theoretically. It also turns out that an improvement of about 5 dB can be achieved between −0.5 and −0.8, not only at −0.6, set for the coefficient of mutual induction.

Figure 14B:
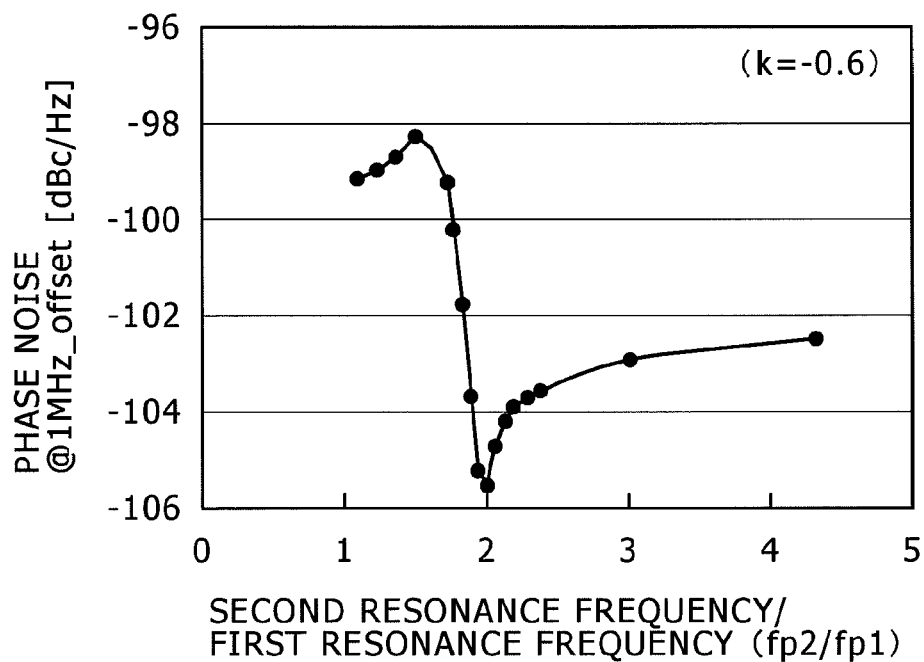

FIG. 14B is a graph representing a phase noise characteristic, when K is set to −0.6 and the ratio of the second resonance frequency to the fundamental frequency is set at 2:1 and smaller and greater than 2:1. This graph indicates that the highest effect of phase noise improvement is attained when the ratio of the second resonance frequency to the first (fundamental) frequency is 2:1. A considerable degree of improvement can be achieved even when the ratio varies within a certain range around the ratio of 2:1, not only at 2:1, on account of the same reason as for the coefficient of mutual induction.

Figure 15:
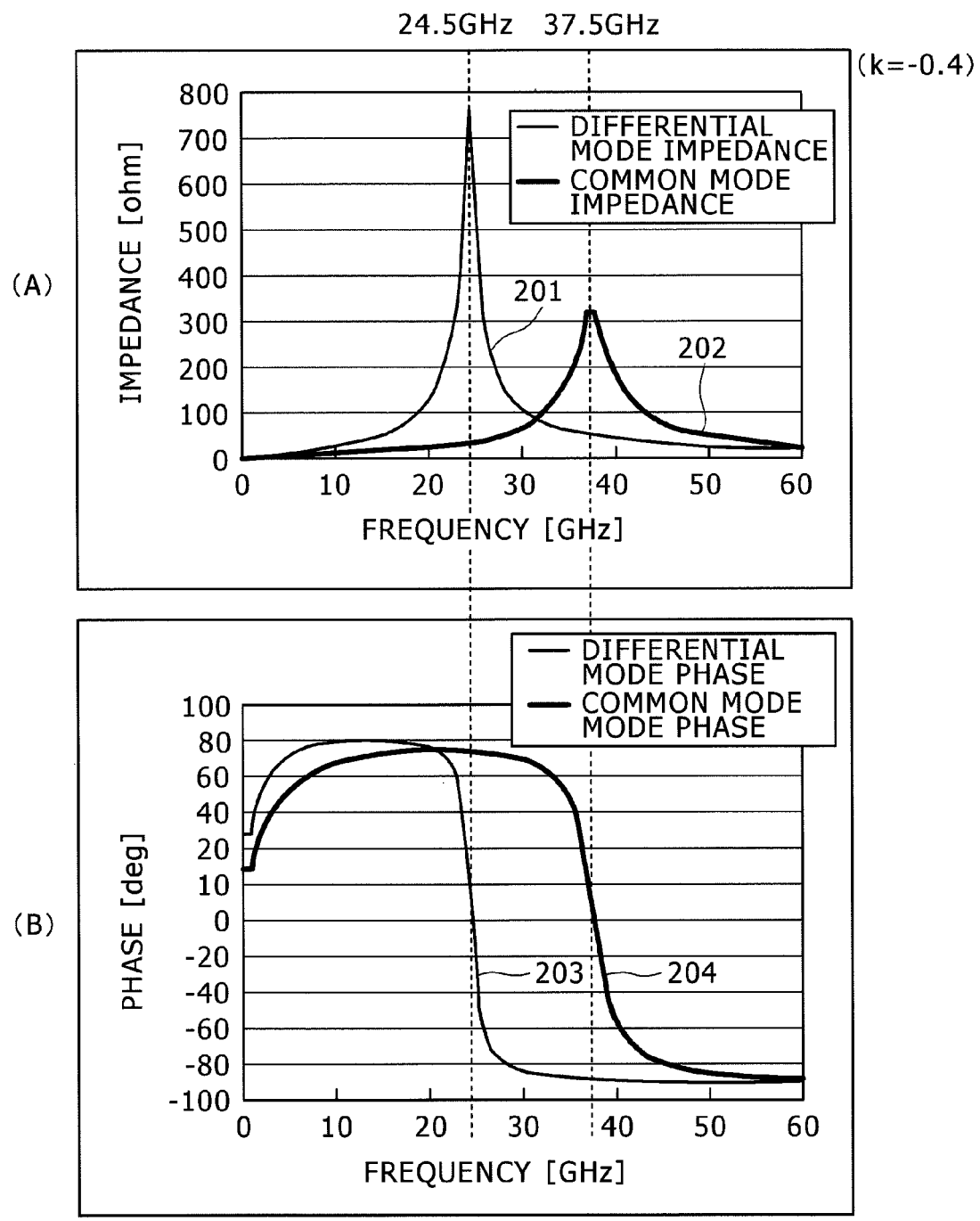
FIG. 15 shows graphs representing frequency characteristics, when K is set to −0.4 in a resonator analogous to the resonator in the third embodiment.

FIG. 15 shows graphs representing frequency characteristics obtained using the circuit simulator, when K is set to −0.4 in a resonator analogous to the resonator in the third embodiment of the present invention as a comparison example. FIG. 15A shows impedance characteristics and FIG. 15B shows frequency characteristics of the phases. As can be seen in FIG. 15A and FIG. 15B, the first and second parallel resonance frequencies are 24.5 GHz and 37.5 GHz, respectively. It thus turns out that, when K=−0.4, such an effect is not achievable that the oscillation frequency is set greater than the fundamental frequency by a factor of 2 or around 2.

According to the third embodiment, the phase of the second harmonic voltage generated from the oscillator can be fixed to a phase in which the ISF of channel thermal noise becomes minimum. As a result, it is possible to reduce the phase noise deterioration due to oscillation voltage waveform distortions and increase the amplitude of the oscillation voltage. It is thus possible to realize an oscillator having a low phase noise characteristic.

The inductors mutually inductively coupled in a negative direction, included in the oscillator of the third embodiment, are able to increase the Q factor of the inductors, because the currents flow in the same direction in the inductors, thus increasing together the levels of the magnetic fields of the signals. Furthermore, in the layout of the resonator in the third embodiment, two inductors can be installed in an area occupied by one spiral inductor. Consequently, cost reduction is also feasible due to chip area shrinkage.

Embodiment 4

Figure 16:
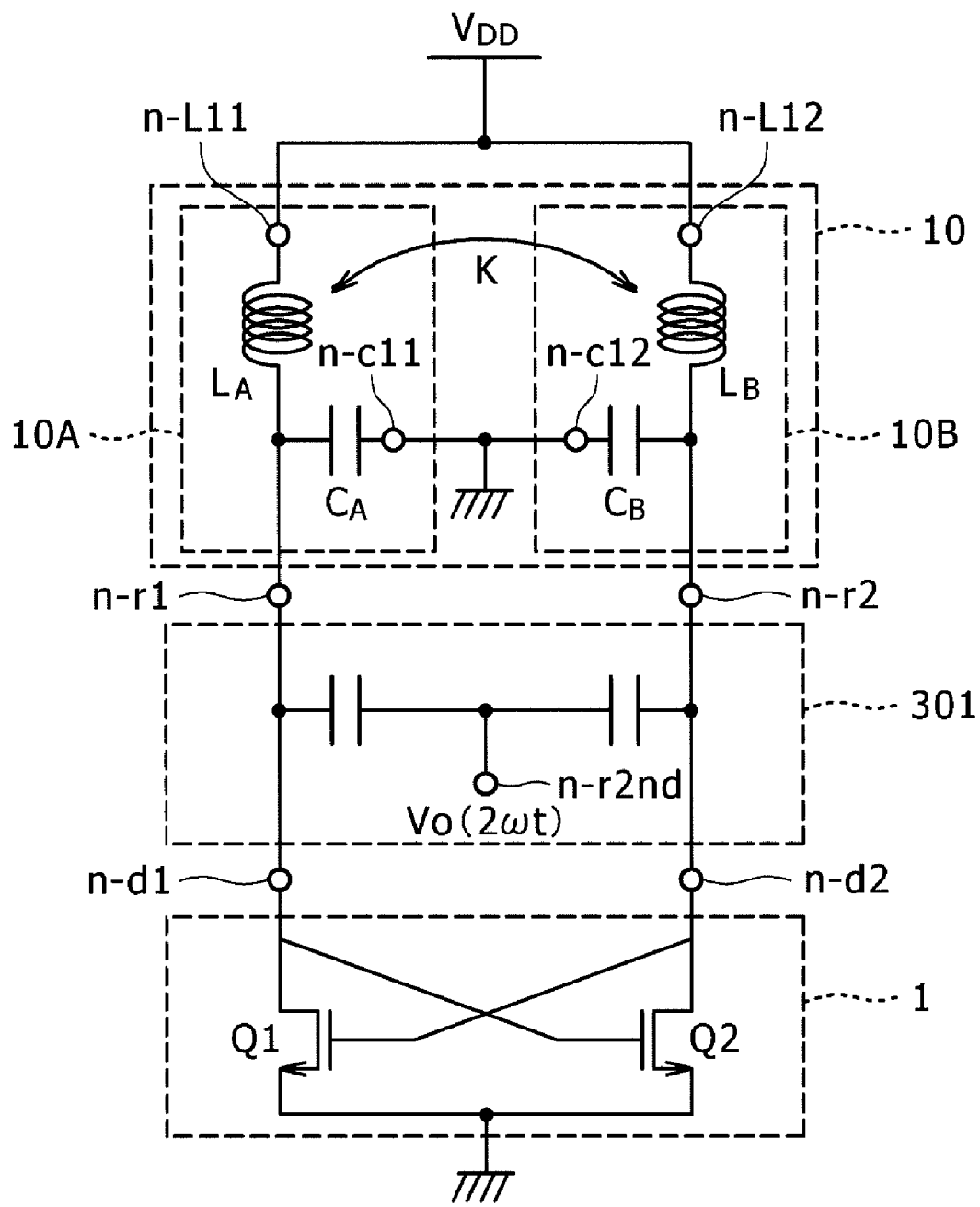
FIG. 16 is a circuit diagram showing a circuit configuration of an oscillator according to a fourth embodiment of the present invention.

A forth embodiment of the present invention relates to a push-push type oscillator to which the oscillator of the third embodiment of the invention is applied. The fourth embodiment is described below. FIG. 16 shows an example of a push-push type oscillator to which the oscillator of the third embodiment is applied. Two capacitors 301 are connected to the input/output terminals n-r1 and n-r2 of the resonator 10 in the oscillator of FIG. 11. By drawing a signal from a middle point n-r2nd between the capacitors, it is possible to cancel out the fundamental signal and bring out only the second harmonic.

The oscillator of the third embodiment allows for enlarging the amplitude of the second harmonic voltage, because a parallel resonance point is at a frequency that is just double the oscillation frequency, that is, the frequency corresponding to the second harmonic. Moreover, the oscillator of the third embodiment have a low sensitivity for phase noise deterioration due to the second harmonic. Therefore, a push-push type oscillator having a good phase noise characteristic can be realized. Accordingly, the phase noise characteristic can be improved even for the push-push type oscillator in the same way as for the third embodiment.

Embodiment 5

Figure 17:
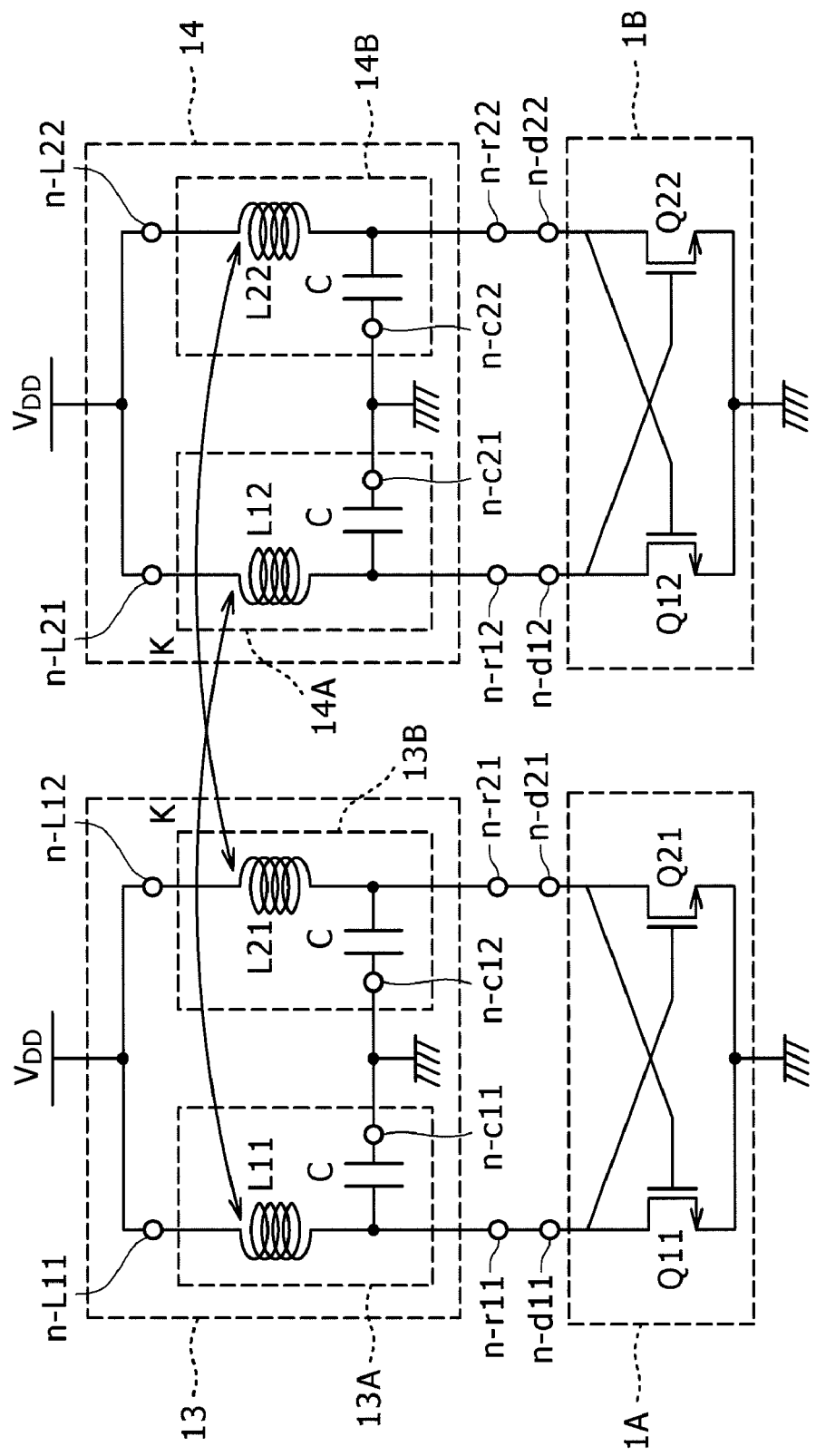
FIG. 17 is a circuit configuration diagram to explain a principle of an oscillator according to a fifth embodiment of the present invention.

A fifth embodiment of the present invention is described, referring to FIG. 17 through FIG. 22B. First, FIG. 17 is a circuit configuration diagram to explain the principle of the oscillator according to the fifth embodiment of the present invention. The oscillator of the fifth embodiment is made up of a first voltage to current converter 1A formed of transistors Q11, Q21 grounded to a common ground, a second voltage to current converter 1B formed of transistors Q12, Q22 grounded to another common ground, a first resonator 13 (13A, 13B), and a second resonator 14 (14A, 14B).

The first voltage to current converter 1A has first and second terminals. The first terminal is a terminal n-d21 serving as both an input terminal for inputting an output voltage from a resonator 13B and an output terminal for outputting a current signal after being voltage to current converted in the transistor Q21. The second terminal is a terminal n-d11 serving as both an input terminal for inputting an output voltage from a resonator 13A and an output terminal for outputting a current signal after being voltage to current converted. The second voltage to current converter 1B has first and second terminals. The first terminal is a terminal n-d22 serving as both an input terminal for inputting an output voltage from a resonator 14B and an output terminal for outputting a current signal after being voltage to current converted in the transistor Q22. The second terminal is a terminal n-d12 serving as both an input terminal for inputting an output voltage from a resonator 14A and an output terminal for outputting a current signal after being voltage to current converted.

The first resonators 13A, 13B are made up of capacitors C and inductors L. Each resonator 13A, 13B has at least three terminals: first, second, and third terminals. In the fifth embodiment, the first terminal of the resonator 13A (13B) is an input terminal n-r11 (n-r21) for inputting an output current from the voltage to current converter 1A and connecting to the input terminal of the voltage to current converter to feed back a signal of only a particular frequency selected according to frequency characteristics of the resonator 13. The second and third terminals of the resonator 13A (13B) are AC grounded terminals for connection to a DC power supply for the resonator, a control voltage, etc., the second and third terminals including n-C11, n-L11 (n-C21, n-L21). Likewise, the first terminal of the resonator 14A (14B) is an input terminal n-r12 (n-r22) for inputting an output current from the voltage to current converter 1 and connecting to the input terminal of the voltage to current converter to feed back a signal of only a particular frequency selected according to frequency characteristics of the resonator 14. The second and third terminals of the resonator 14A (14B) are terminals for connection to the DC power supply for the resonator, the control voltage, etc., the second and third terminals including n-C12, n-L12 (n-C22, n-L22). The inductors L11, L12 (L21, L22) included in the resonators 13A, 14A (13B, 14B) are mutually inductively coupled and a coefficient of mutual reduction between them is about −0.6. The inductors L11, L12, L21, L22 have virtually equal values of inductance L.

The oscillator of the fifth embodiment has two feedback loops, as will be described below. A first feedback loop is formed as follows. The first voltage to current converter 1A converts a voltage signal input from its input terminal n-d21 (or n-d11) into a current which is in turn output from its output terminal n-d11 (or n-d21) connected to the input terminal n-r11 (or n-r21) of the resonator 13A (or 13B). The resonator selects only a particular frequency according to its frequency characteristics and converts the current into a voltage which is in turn fed back to the input terminal n-d11 (or n-d21) of the voltage to current converter 1A. A second feedback loop is formed as follows. The second voltage to current converter 1B converts a voltage signal input from its input terminal n-d22 (or n-d12) into a current which is in turn output from its output terminal n-d12 (or n-d22) connected to the input terminal n-r12 (or n-r22) of the resonator 14A (or 14B). The resonator selects only a particular frequency according to its frequency characteristics and converts the current into a voltage which is in turn fed back to the input terminal n-d12 (or n-d22) of the voltage to current converter 1B.

In the oscillator of the fifth embodiment, the transistors Q11 and Q21 (Q12, Q22) constituting the voltage to current converter 1A (1B) are cross coupled. Due to this, between output terminals n-d11 and n-d21 (n-d12 and n-d22), output voltage signals with a fundamental frequency and odd harmonics behave as differential signals and output voltage signals with even harmonics such as a second harmonic become common mode signals.

In a case where the transistors Q11, Q21, Q12, Q22 constituting the voltage to current converters 1A and 1B are implemented by CMOS process, the terminal n-d11 of the voltage to current converter 1A becomes a drain terminal of Q11 and a gate terminal of Q21 and its terminal n-d12 becomes a gate terminal of Q11 and a drain terminal of Q21. Likewise, the terminal n-d12 of the voltage to current converter 1B becomes a drain terminal of Q12 and a gate terminal of Q22 and its terminal n-d22 becomes a gate terminal of Q12 and a drain terminal of Q22.

Figure 18:
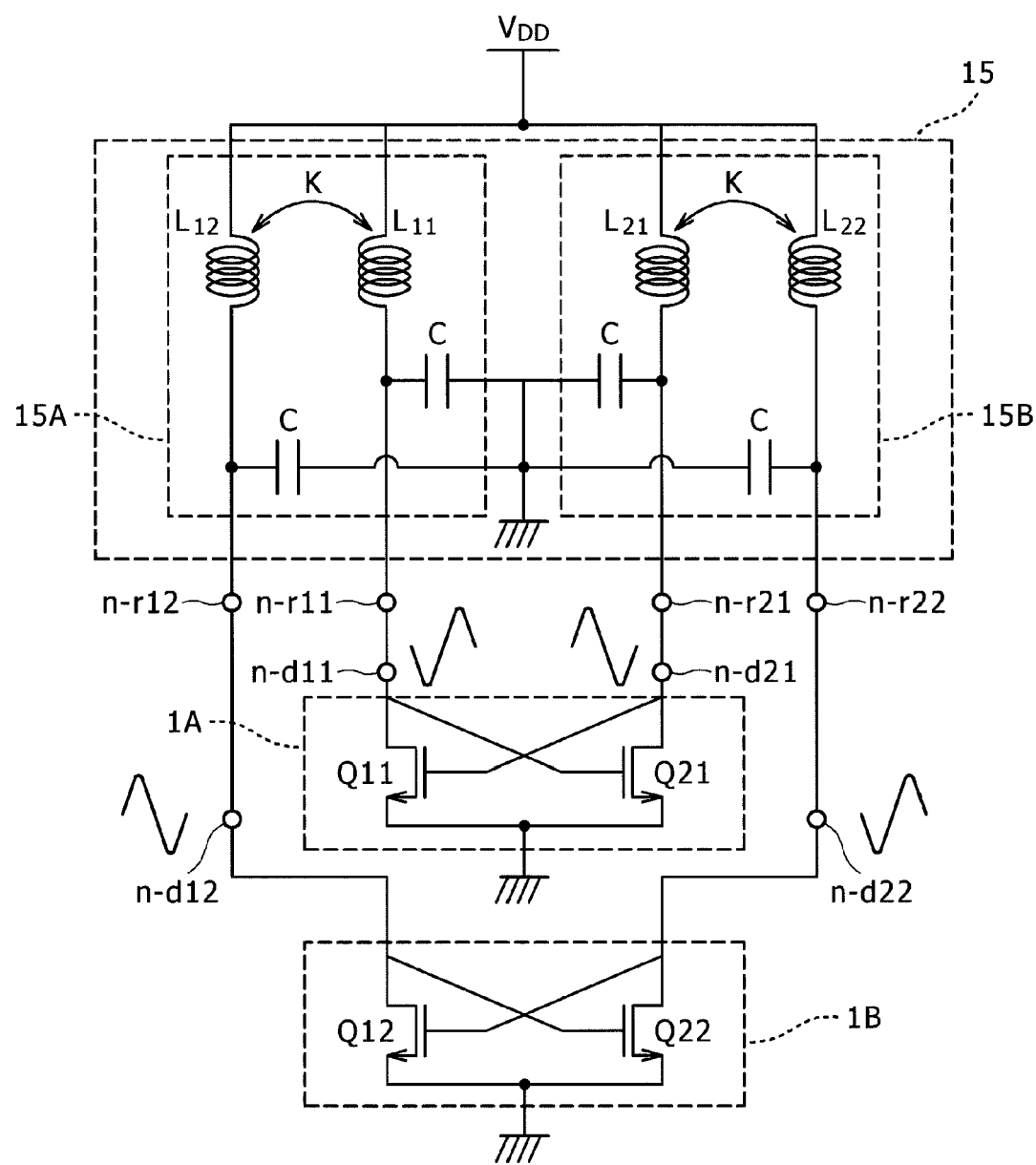
FIG. 18 is a circuit diagram showing a practical circuit configuration of the oscillator according to the fifth embodiment of the present invention.

FIG. 18 is a circuit diagram showing a practical circuit configuration of the oscillator according to the fifth embodiment of the present invention. In the practical circuit configuration, a resonator 15 is provided in which the resonator elements 13A and 14A in FIG. 17 are combined into a resonator element 15A and the resonator elements 13B and 14B in FIG. 17 are combined into a resonator element 15B.

The resonators 15A, 15B in FIG. 18 are similarly configured as in the resonator 10 used in the oscillator of the first and third embodiments. The principle of the resonator is as described with regard to the third embodiment. A resonance frequency $f_{RS,DIFF}$ when differential signals are input to the terminals n-r11 and n-r21 (terminals n-r12 and n-r22) of the resonator 15A is formulated by Equation (13) as described previously. A resonance frequency $f_{RS,COM}$ when common mode signals are input is formulated by Equation (14) as described previously. The above principle also elucidates that the signals between the terminals n-r12 and n-r11 (terminals n-r21 and n-r22) behave in differential mode at a resonance frequency $f_{RS,DIFF}$.

As in the third embodiment, the ratio between the parallel resonance frequency $f_{RS,DIFF}$ when differential currents are input and the parallel resonance frequency $f_{RS,COM}$ when common mode currents are input is constantly 1:2, independent of the inductance and capacitance values of the inductors L and the capacitors C comprised in the resonators 15A, 15B. This means that, when the parallel resonance frequency $f_{RS,DIFF}$ of differential signals is taken as the oscillation frequency of the oscillator, the parallel resonance frequency $f_{RS,COM}$ of common mode signals coincides with the second harmonic passing as common mode signals via the terminals n-d11, n-d21, n-d12, n-d22 of the oscillator of the fifth embodiment.

As in the first and third embodiments, the independency of the inductance and capacitance values of the inductors L and the capacitors C is an important element. In a case where the oscillator of the fifth embodiment is configured to be operable as a VCO whose oscillation frequency can be changed by controlling the capacitance values of the capacitors C by a voltage, even if the oscillation frequency is changed, the ratio between the parallel resonance frequency $f_{RS,DIFF}$ for differential signals and the parallel resonance frequency $f_{RS,COM}$ for common mode signals is constantly 1:2, from the relation of Equation (15), independent of the inductance and capacitance values of the inductors L and the capacitors C comprised in the resonator 15.

Figure 19A:
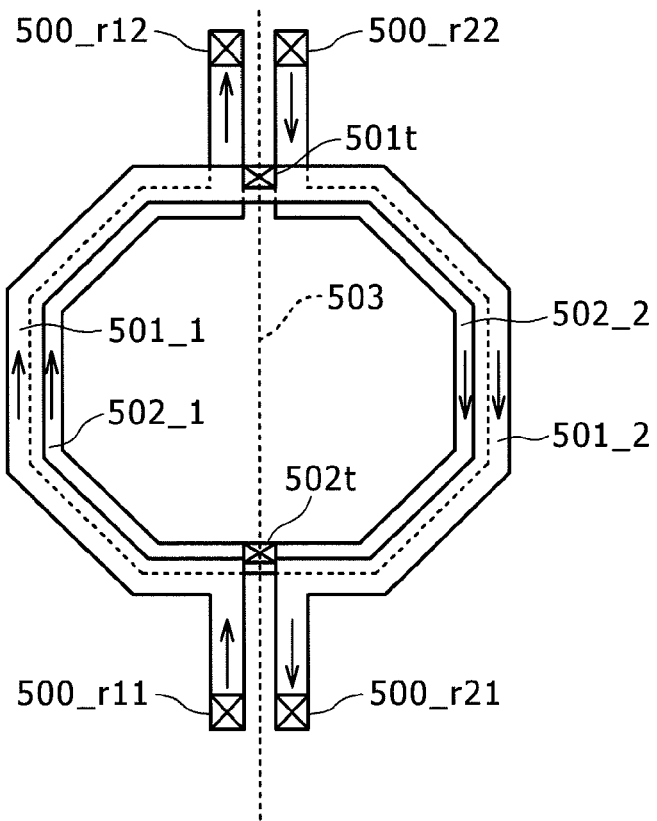
FIG. 19A is a diagram illustrating one example of mask layout of mutually inductively coupled inductors comprised in the oscillator according to the fifth embodiment of the invention.
Figure 19B:
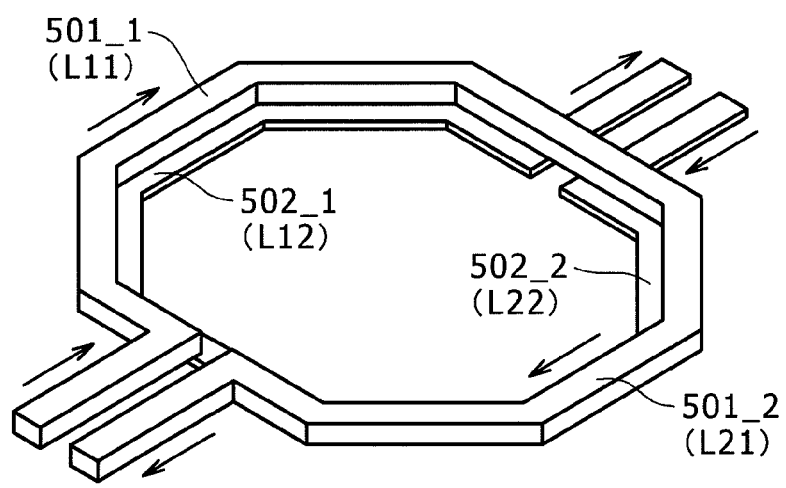
FIG. 19B is a perspective view of the mask layout of FIG. 19A.

The inductors mutually inductively coupled in a negative direction comprised in the oscillator of the fifth embodiment can be implemented by adopting a chip layout as is shown in FIG. 19 (FIG. 19A, FIG. 19B) in one example. FIG. 19A is a diagram illustrating an example of mask layout of mutually inductively coupled inductors included in the oscillator according to the fifth embodiment of the invention. FIG. 19B is a perspective view of the mask layout of FIG. 19A. In FIG. 19A, in the left part with respect to a center line 503, an inductor 501-1 corresponds to an inductor element L11 included in the first resonator in FIG. 17 and an inductor 502_1 corresponds to an inductor element L12 included in the second resonator 14. In the right part with respect to the center line 503, an inductor 501_2 corresponds to an inductor element L21 included in the first resonator 13 and an inductor 502_2 corresponds to an inductor element L22 included in the second resonator 14. In FIG. 19A, a terminal 501_r11 corresponds to the terminal n-r11 of the first resonator 13 in FIG. 17. Likewise, a terminal 501_r21 corresponds to the terminal n-r21 of the first resonator 13, a terminal 502_r12 corresponds to the terminal n-r12 of the second resonator 14, and a terminal 502_r22 corresponds to the terminal n-r22 of the second resonator 14, respectively. Terminals 501t, 502t are the terminals for connection to the DC power supply for the resonator and others. Outer inductors (501_1, 501_2) are made of an upper thicker metal layer and inner inductors (502_1, 502_2) are made of a lower thinner metal layer. This way of making the inductors enables that the four inductors have practically equal values of inductance and the coefficient of mutual induction is designed to be a desired value.

Mutual inductive action between two inductors (L11 and L21) constituting the first resonator 13 and between two inductors (L12 and L22) constituting the second resonator 14 is negligible; that is, these inductors are disposed, spaced apart from each other on chip to decrease the coefficient of mutual induction K between them to a negligible level. Conversely, a pair of the inductor 501_1 (L11) for the first resonator 13 and the inductor 502_1 (L12) for the second resonator 14 and a pair of the inductor 501_2 (L22) for the first resonator 13 and the inductor 502_2 (L21) for the second resonator 14 are disposed close to each other on chip, for example, as the upper and lower layers, to ensure the mutual inductive action between them, indicated by the coefficient of mutual induction K.

Differential action to a fundamental signal takes place between the terminals 501_r11 and 501_r21 (and the terminals 502_r12 and 502_r22) which are input terminals of the resonators in FIG. 19. Therefore, the currents flowing in the outer inductors (501_1, 501_2) and the inner inductors (501_2, 502_2) flow in the same direction, thus increasing together the levels of the magnetic fields of the signals, so that the Q factor of the inductors can rise. In the resonator layout of the fifth embodiment, four inductors can be installed in an area occupied by one spiral inductor. Consequently, cost reduction is also feasible due to chip area shrinkage.

Since the oscillator of the fifth embodiment has the resonator characteristics and conversion characteristics of the voltage to current converters 1 which are the same as in the first embodiment, the voltage amplitude waveforms, ISF curves, channel thermal noise waveforms, and channel thermal noise ISF curves of the fundamental oscillation signal and the second harmonic signal at the terminals n-d11, n-d21 (n-d12, n-d22) correspond to the characteristics as shown in FIG. 7A to FIG. 7C.

Thus, the oscillator in the fifth embodiment of the present invention is able to fix the phase of the second harmonic voltage generated from the oscillator to a phase in which the ISF of channel thermal noise becomes minimum. As a result, it is possible to reduce the phase noise deterioration due to oscillation voltage waveform distortions and increase the amplitude of the oscillation voltage. It is possible to realize an oscillator having a low phase noise characteristic and a communication system using the oscillator.

Figure 20:
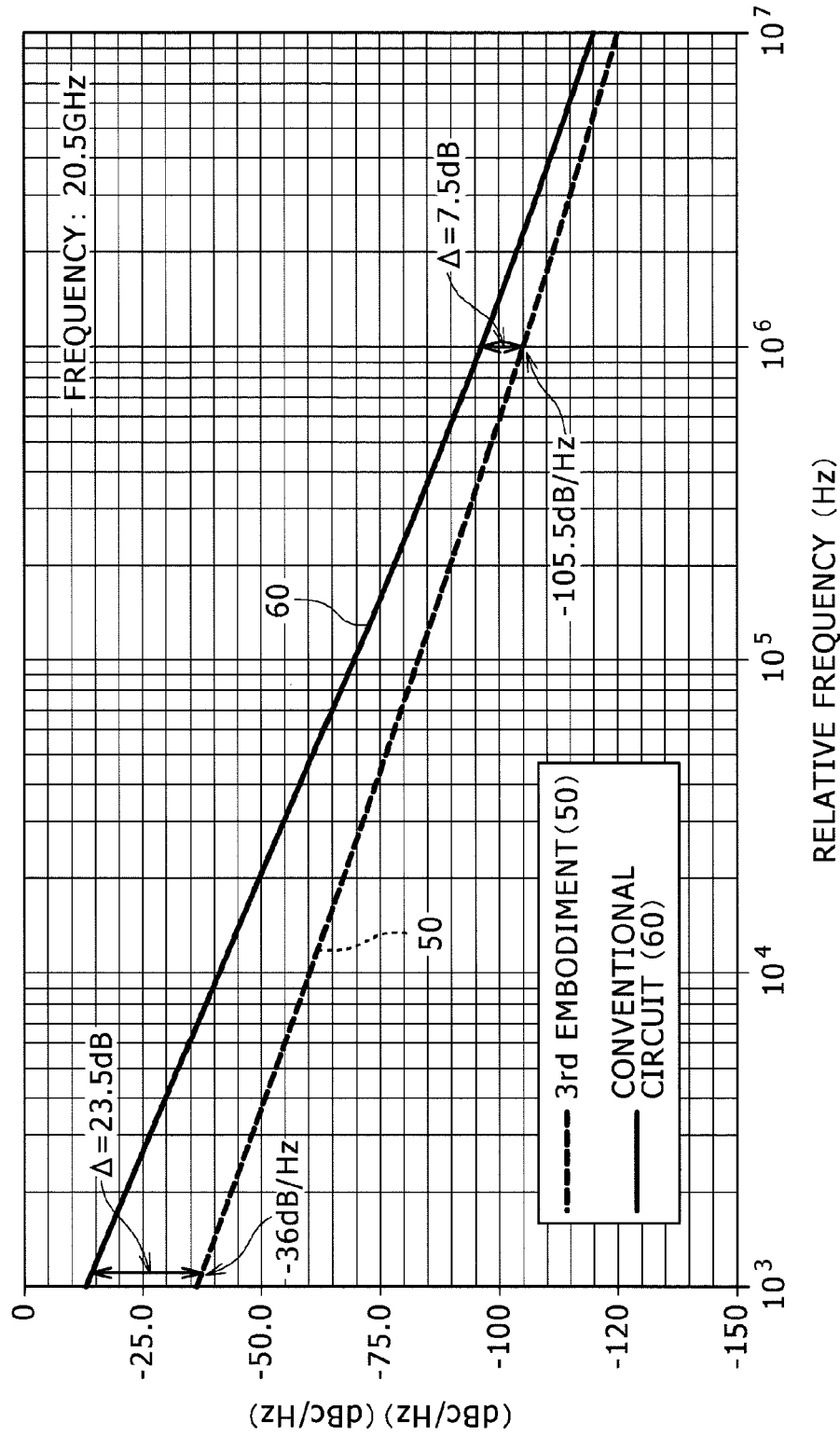
FIG. 20 shows a graph representing the results of simulating the phase noise characteristics of the oscillator according to the fifth embodiment of the invention and the oscillator of the conventional example.
Figure 29:
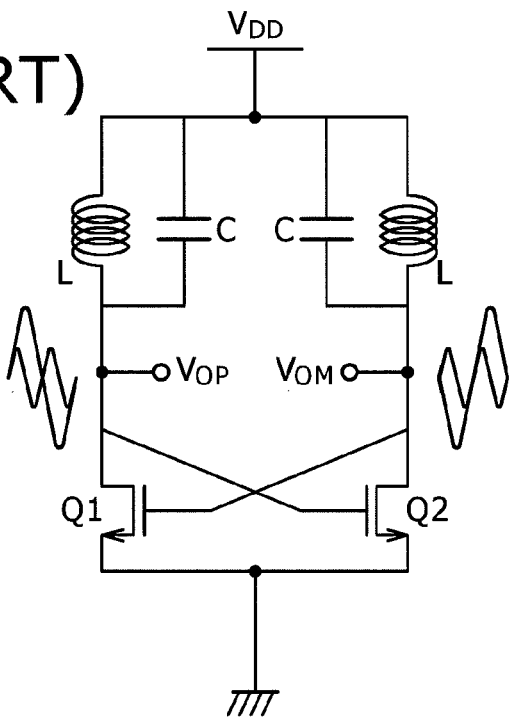
FIG. 29 is a circuit diagram showing another configuration example of a conventional oscillator.
Figure 30A:
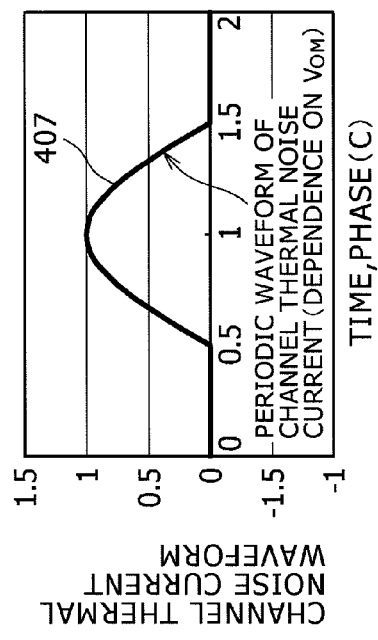
FIGS. 30A-30D show a set of waveform diagrams plotting a waveform of an oscillation voltage when only a fundamental wave of a conventional oscillator is taken into consideration and waveforms which represent various characteristics.
Figure 30C:
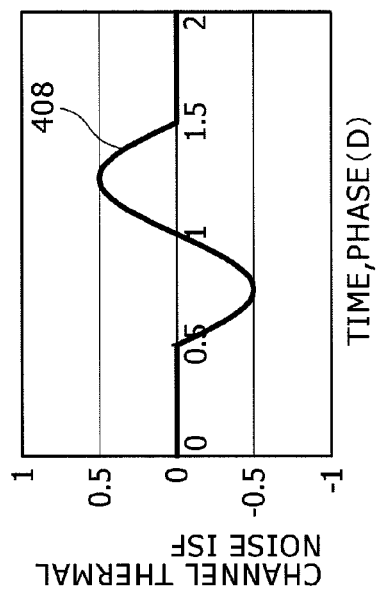
Figure 30B:
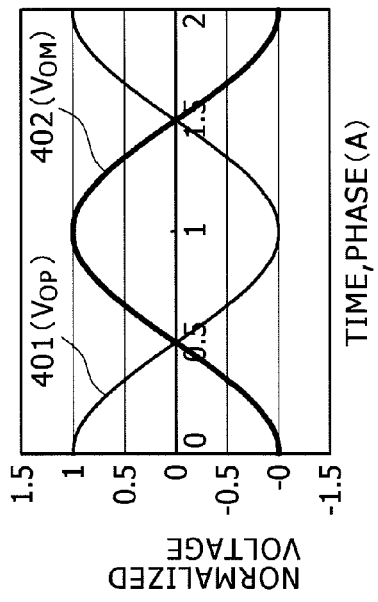
Figure 30D:
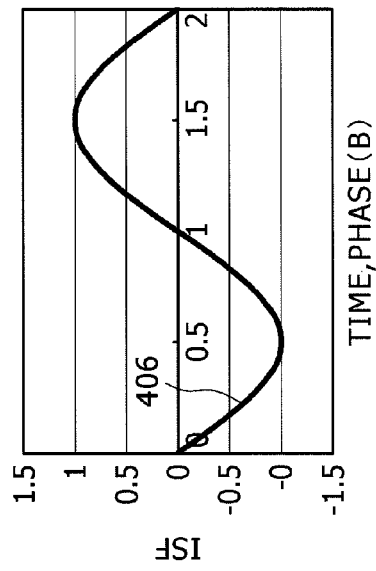
Figure 31:
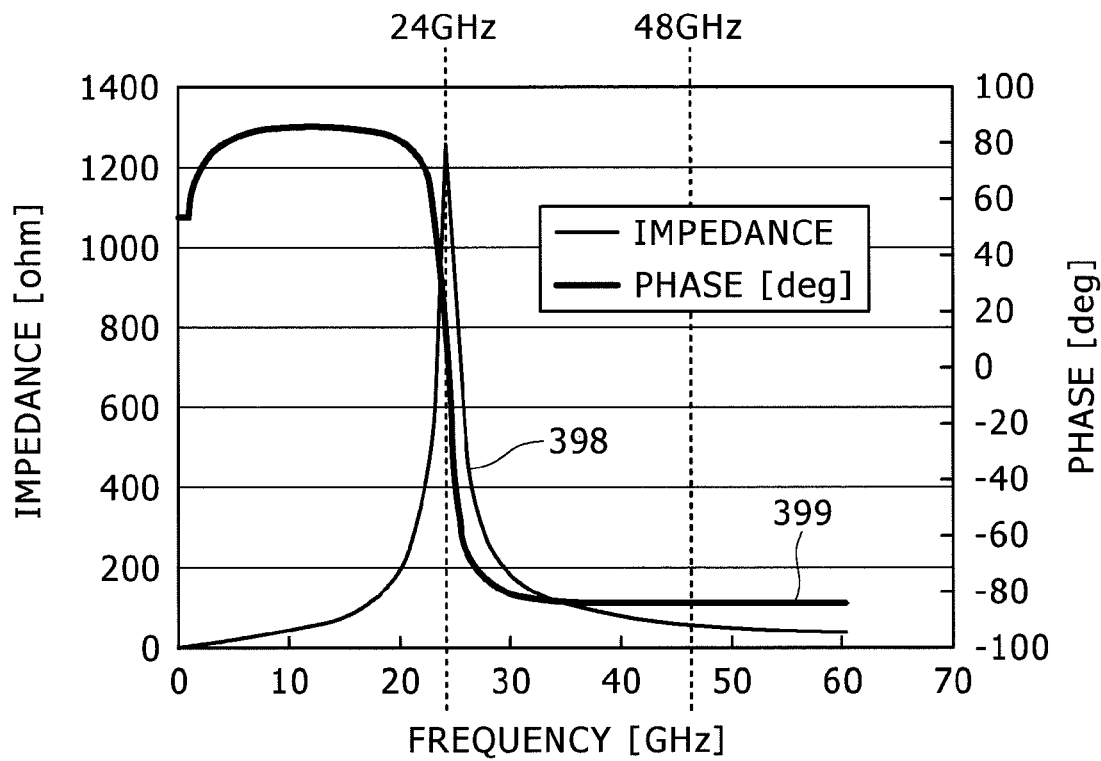
FIG. 31 shows a graph plotting frequency characteristics of a resonator used in the conventional oscillator.
Figure 32C:
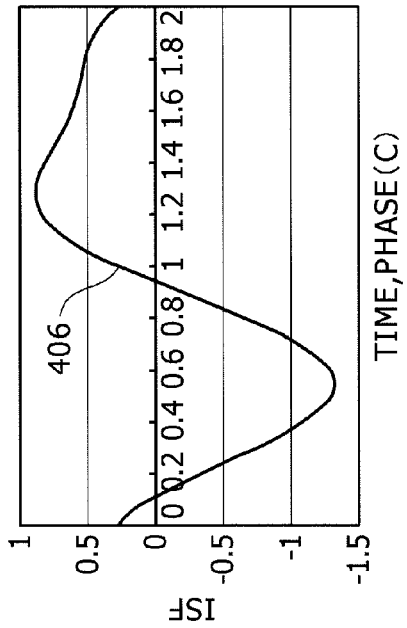
FIGS. 32A-32D show a set of waveform diagrams including voltage waveforms representing a relation between the phase of a fundamental wave and the phase of a second harmonic and waveforms which represent various characteristics.
Figure 32D:
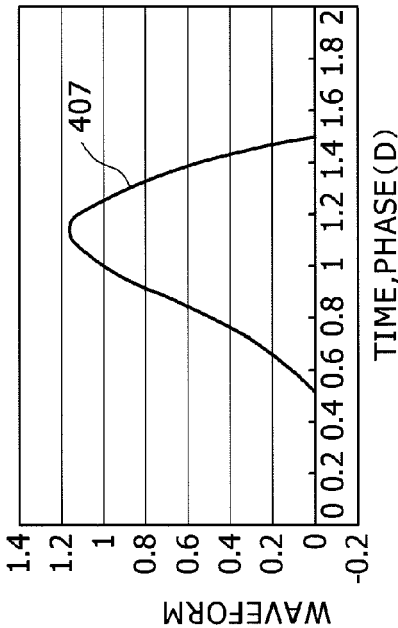
Figure 32A:
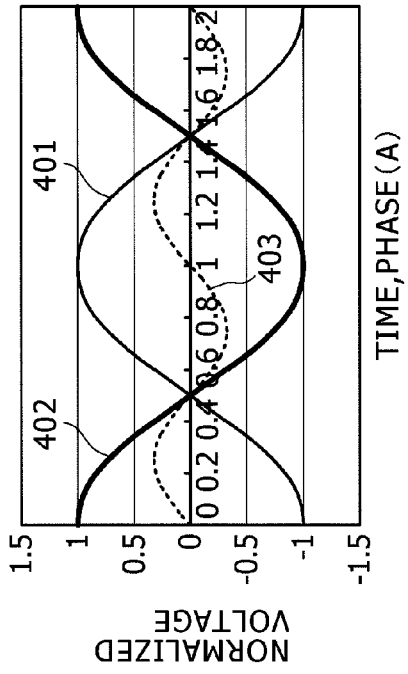
Figure 32B:
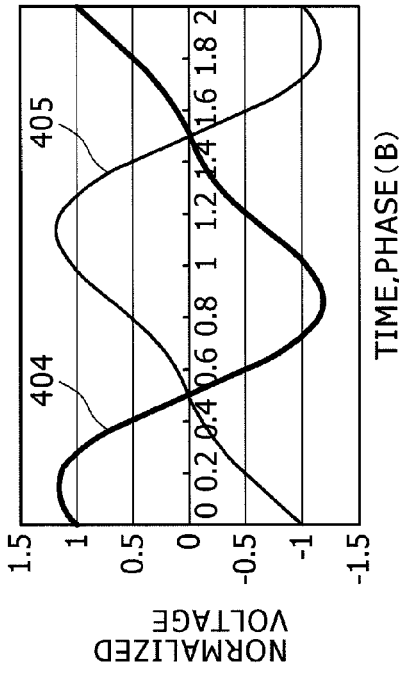
Figure 33:
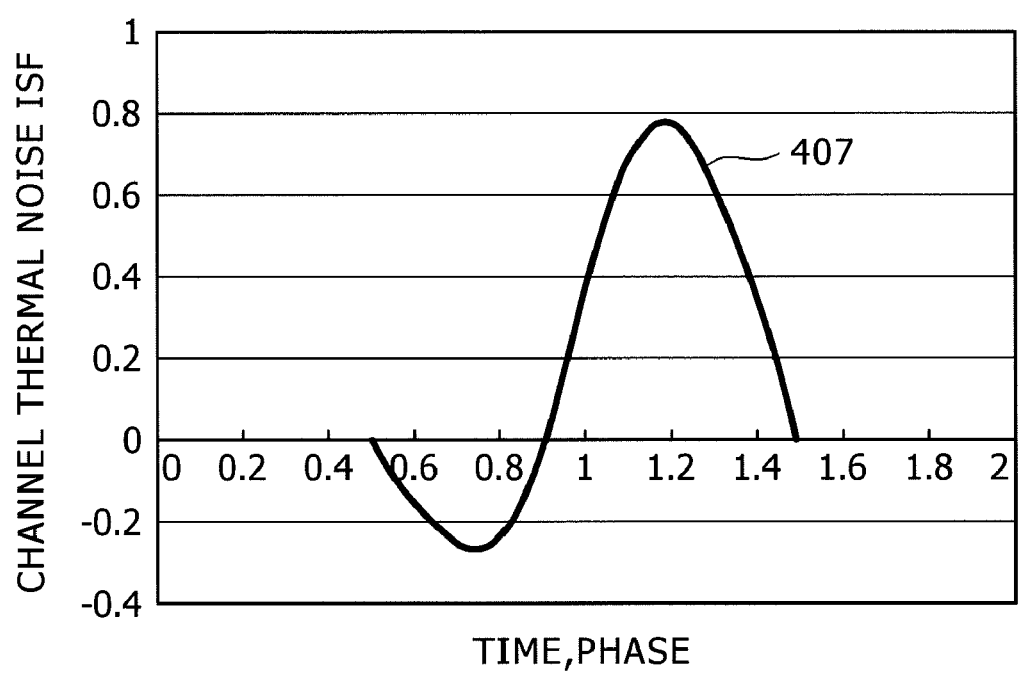
FIG. 33 shows a waveform diagram of a function of impulse sensitivity to channel thermal noise derived when a fundamental wave and a second harmonic are taken into account.

A phase noise 60 of the oscillator of the conventional example shown in FIG. 29 and a phase noise 50 of the oscillator of the fifth embodiment shown in FIG. 17 were derived using the circuit simulator on the assumption that both oscillators oscillate at the same oscillation frequency (20.5 GHz) and consume the same amount of power; its result is shown in a graph of FIG. 20. It turns out that the oscillator of the fifth embodiment of the invention achieves a phase noise improvement, i.e., 23.5 dB less than at an offset frequency of 1 kHz and a 7.5 dB less than at an offset frequency of 1 MHz the phase noise of the oscillator of the conventional example of FIG. 29.

Figure 21A:
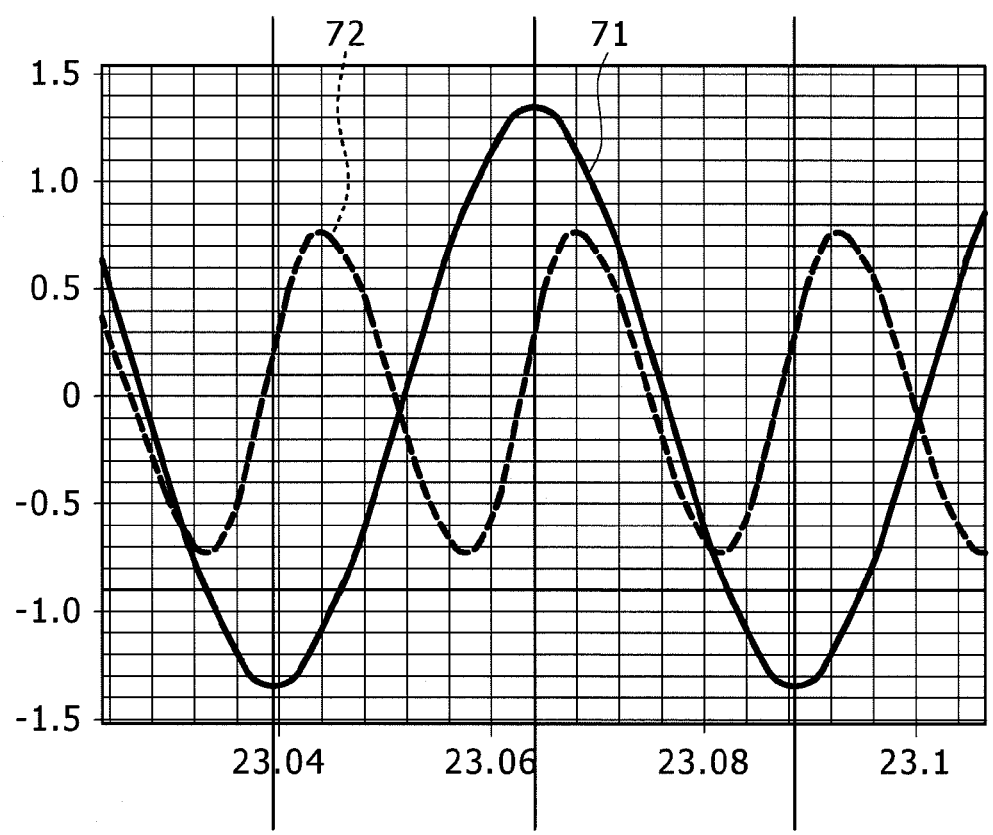
FIG. 21A shows a graph representing a result of simulating the oscillator of the conventional example by transient analysis.

Using the circuit simulator, oscillation signal waveforms of the oscillator of the conventional example shown in FIG. 29 were derived by transient analysis and the waveforms of a fundamental signal 71 and a second harmonic signal 72 are separately plotted in a graph of FIG. 21A. Similarly, oscillation signal waveforms of the oscillator of the fifth embodiment of the invention were derived by transient analysis and the waveforms of a fundamental signal 81 and a second harmonic signal 82 are separately plotted in a graph of FIG. 21B.

Figure 21B:
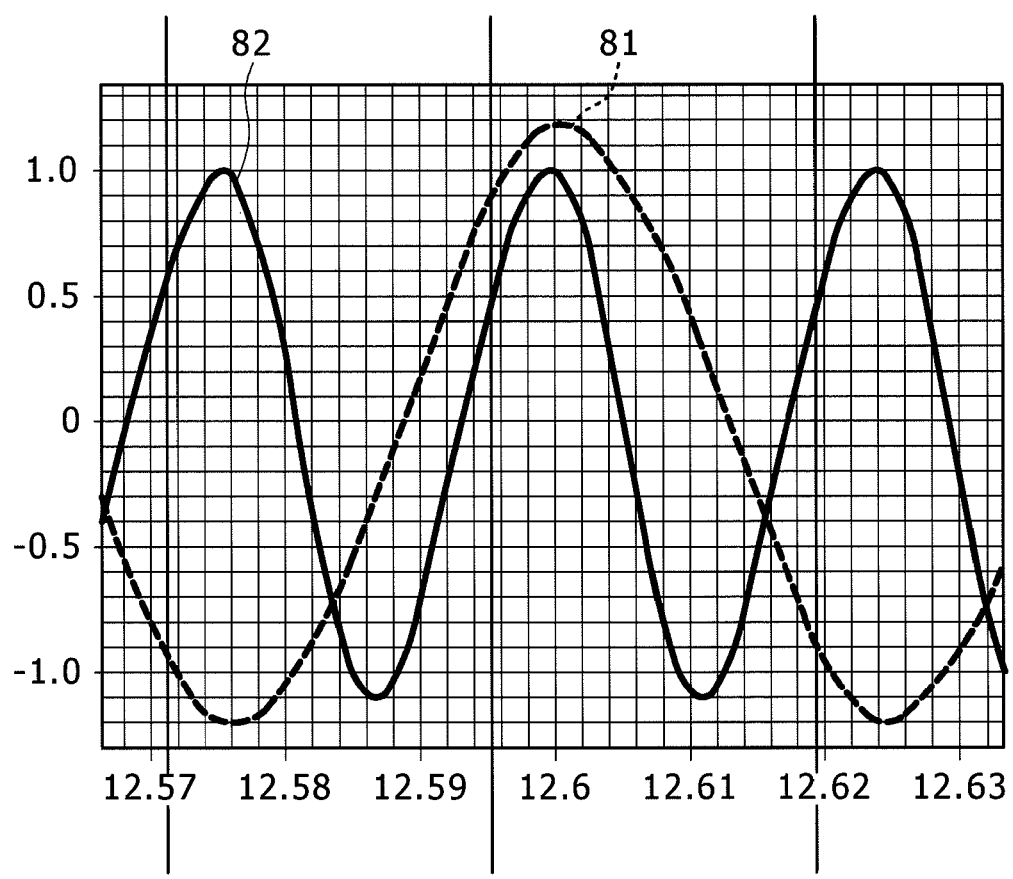
FIG. 21B shows a graph representing a result of simulating the oscillator according to the fifth embodiment of the invention by transient analysis.

FIG. 21A implies that, as formulated in Equation (8), there is a relation that the phase of the fundamental wave 71 is sin $\omega_0 t$ and the phase of the second harmonic 72 is sin $2\omega_0 t$. From this relation, that is, it turns out that channel thermal noise ISF is largely deteriorated by the second harmonic. On the other hand, the relation between the phase of the fundamental wave 81 and the phase of the second harmonic 82 shown in FIG. 21B is as follows: as formulated in Equation (11), generally, the phase of the fundamental wave 81 is sin $\omega_0 t$ and the phase of the second harmonic 82 sin($2\omega_0 t - \pi/2$). As described as the effect of the present invention, between the phases of both, there is a relation indicative of that channel thermal noise ISF is less deteriorated by the second harmonic that is, obviously, the phase noise is improved.

Figure 22A:
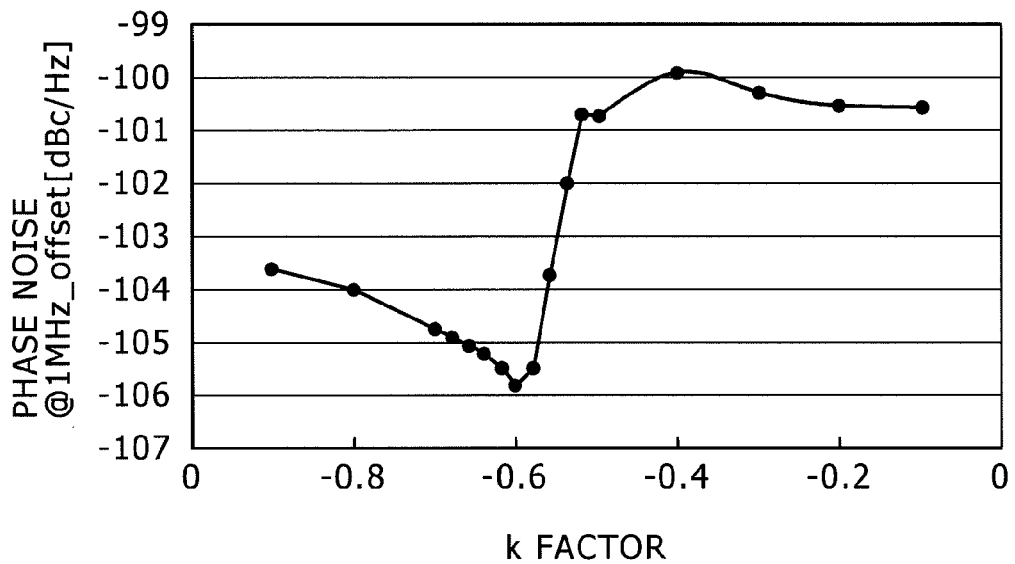
FIGS. 22A-22B show graphs, one representing a result of simulating a variation of phase noise characteristic, when the coefficient of mutual induction K is varied from −0.1 to −0.9; and the other representing a phase noise characteristic, when K is set to −0.6 and the ratio of the second resonance frequency to the fundamental frequency is set at 2:1 and smaller and greater than 2:1 in a resonator analogous to the resonator in the fifth embodiment of the invention.

FIG. 22A shows a result of simulation of a phase noise at a 1 MHz offset using the circuit simulator, when the coefficient of mutual induction between resonator elements 13A, 13B of a resonator 13 in the oscillator according to the fifth embodiment of the present invention is varied in a range from −0.1 to −0.9. For the LC cross coupled oscillator of the conventional example, the factor of K is assumed to be 0. From the simulation result shown in FIG. 22A, it turns out that the phase noise of the oscillator according to the embodiment of the present invention is most improved, when the coefficient of mutual induction is −0.6, as designed theoretically. It also turns out that an improvement of about 5 dB can be achieved between −0.5 and −0.8, not only at −0.6, set for the coefficient of mutual induction. It is preferable to design the coefficient of mutual induction to be −0.6 theoretically, but a considerable degree of improvement can be achieved even if the above coefficient for actual products is slightly larger or smaller than −0.6, i.e., in a range of −0.5 to −0.8 due to manufacturing variation.

Figure 22B:
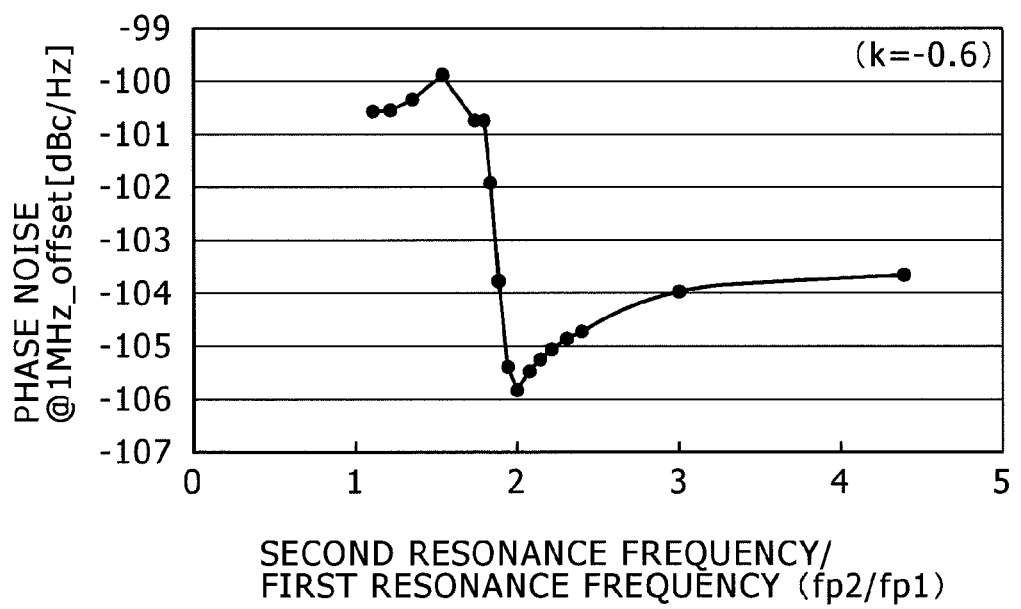

Then, FIG. 22B is a graph representing a phase noise characteristic, when K is set to −0.6 and the ratio of the second resonance frequency to the fundamental frequency is set at 2:1 and smaller and greater than 2:1. This graph indicates that the highest effect of phase noise improvement is attained when the ratio of the second resonance frequency to the first (fundamental) frequency is 2:1. A considerable degree of improvement can be achieved even when the ratio varies within a certain range around the ratio of 2:1, not only at 2:1, on account of the same reason as for the coefficient of mutual induction.

Embodiment 6

Figure 23:
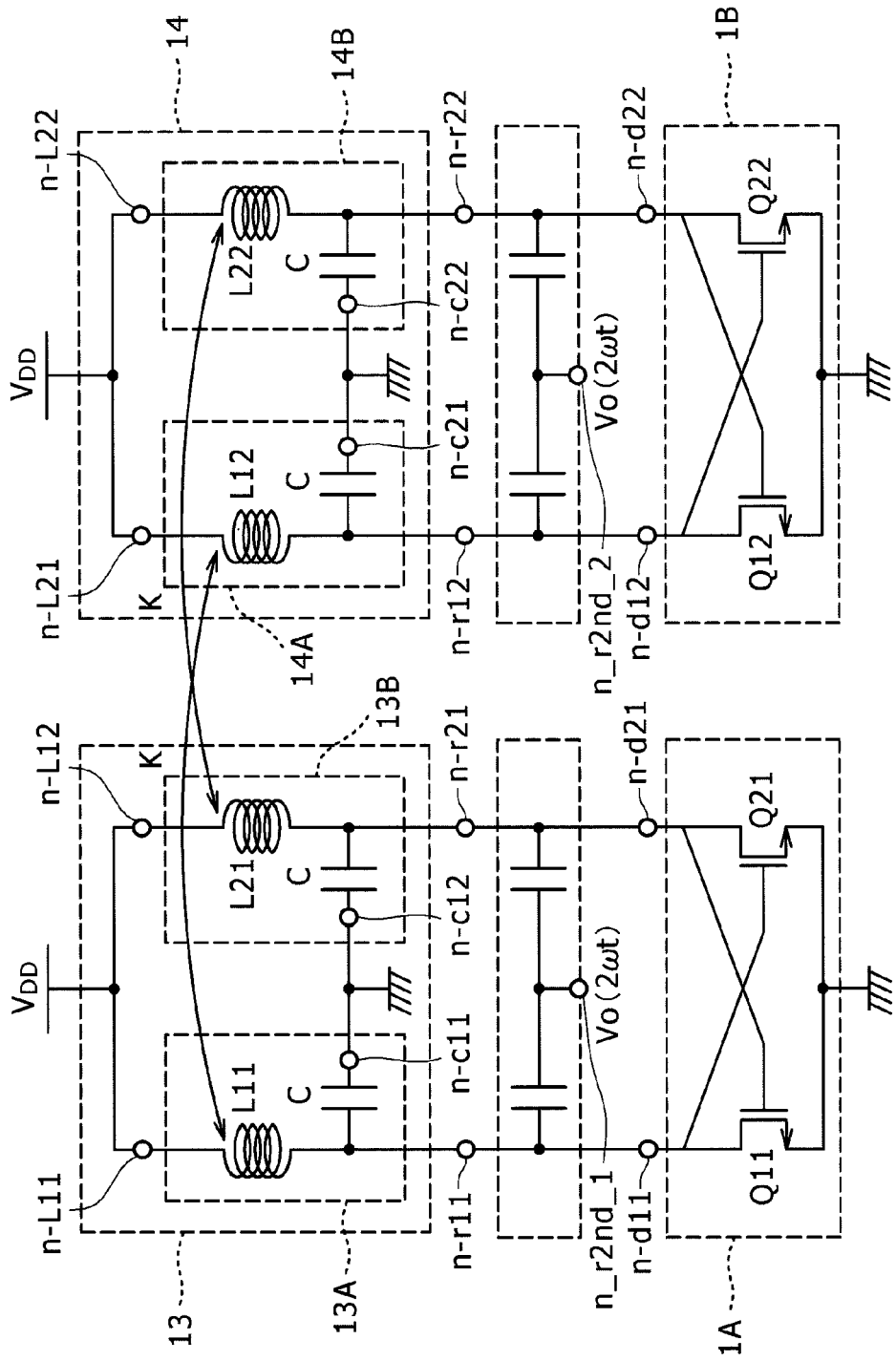
FIG. 23 is a circuit diagram showing a circuit configuration of an oscillator according to a sixth embodiment of the present invention.

FIG. 23 shows one example of a push-push type oscillator to which the oscillator of the fifth embodiment of the invention is applied. As is the case for the above-described third embodiment, the oscillator of the fifth embodiment of the invention also allows for enlarging the amplitude of the second harmonic voltage, because a parallel resonance point is at a frequency that is just double the oscillation frequency, that is, the frequency corresponding to the second harmonic. Moreover, the oscillator of the fifth embodiment have a low sensitivity for phase noise deterioration due to the second harmonic. Therefore, a push-push type oscillator having a good phase noise characteristic can be realized. Specifically, two capacitors 302 (or 303) are connected to the input/output terminals n-r11 and n-r21 (or n-r12 and n-r22) of the resonator 13 (or 14) in the oscillator of FIG. 23. By drawing a signal from a middle point n-r2nd_1 (or n-r2nd_2) between the capacitors, it is possible to cancel out the fundamental signal and bring out only the second harmonic.

Embodiment 7

Figure 24:
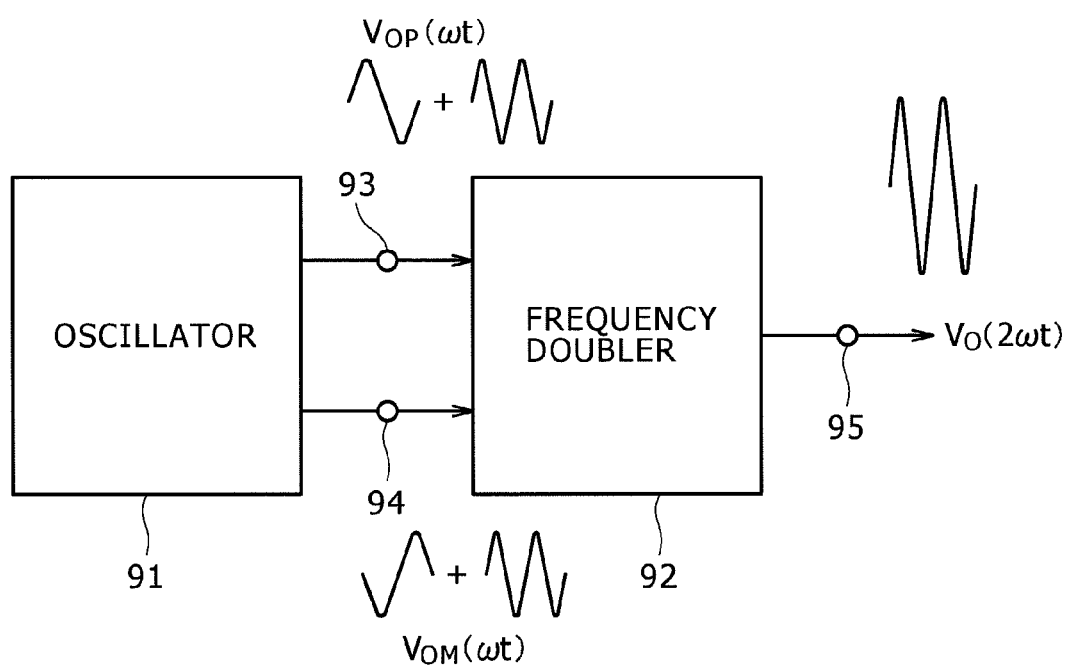
FIG. 24 is a block diagram showing a doubler type oscillator according to a seventh embodiment of the present invention.

A doubler type oscillator according to a seventh embodiment of the present invention is described with regard to FIG. 24. The doubler type oscillator of the seventh embodiment is configured such that output ports 93, 94 of the oscillator 91 according one of the foregoing embodiments 1 to 6 are connected to a frequency doubler 92. Thereby, it is possible to attenuate fundamental signals output from the oscillator 91 and bring out only the second harmonic effectively. In the oscillator according one of the above-described embodiments 1 to 6, a parallel resonance point is at a frequency that is just double the oscillation frequency, that is, the frequency corresponding to the second harmonic. Thus, the second harmonic with a large amplitude is output at the output terminals 93, 94 and it is possible to bring out a frequency doubled signal with a large amplitude more effectively. Furthermore, the phase of the second harmonic voltage generated from the oscillator according one of the foregoing embodiments 1 to 6 is fixed to a phase in which the ISF of channel thermal noise becomes minimum. It is thus possible to reduce the phase noise deterioration due to oscillation voltage waveform distortions and increase the amplitude of the oscillation voltage. It is possible to configure a doubler type oscillator with a low phase noise.

Embodiment 8

Figure 25:
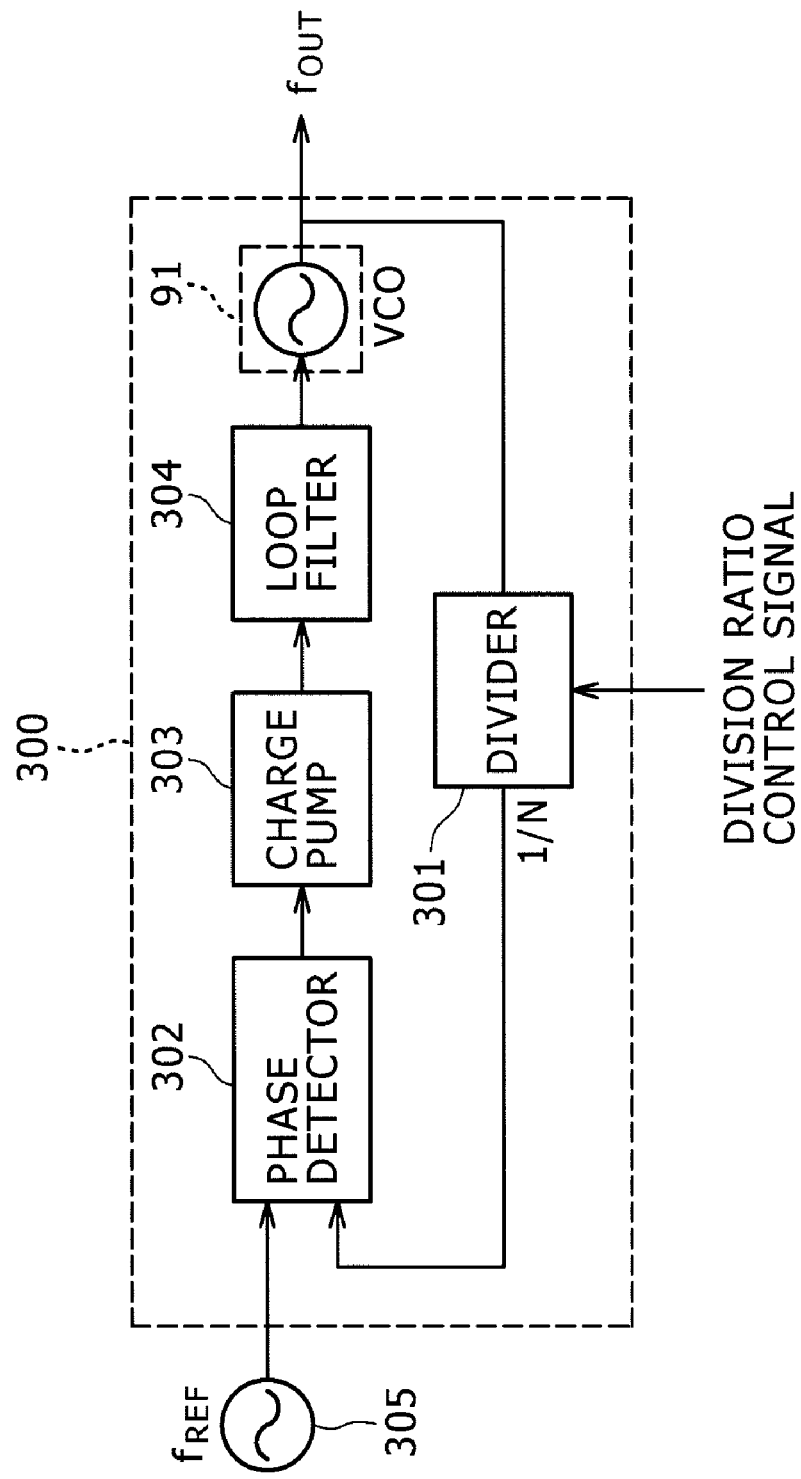
FIG. 25 is a block diagram showing a frequency synthesizer according to an eighth embodiment of the present invention.

Then, FIG. 25 is a block diagram shown a configuration of a frequency synthesizer (as a frequency generating circuit) according to an eighth embodiment of the present invention. This frequency synthesizer 300 is configured as PLL (Phase Locked Loop) and employs an oscillator as a reference frequency generator having a good frequency-temperature characteristic. Specifically, the frequency synthesizer is configured as follows. It is provided with a voltage controlled oscillator VCO 91 whose frequency can be changed by an external control voltage, the VCO comprising an oscillator according to any of the above-mentioned embodiments. A high frequency signal oscillated by the VCO is divided by N by a divider 301 whose division number N can be changed by an external control signal. The signal divided by N is phase-compared to a reference clock 305 in a phase comparator 302 which in turn outputs a switching signal to turn a charge pump 303 ON for a time in proportion to a phase difference between the signal divided by N and the reference clock. The charge pump performs a current injection or current draw operation into/from the following loop filter in proportion to the phase difference between the signal divided by N and the reference clock and controls a value of control voltage which is input to the VCO. When the above loop is locked, the output signal frequency of the VCO becomes $f_{OUT}=N \cdot f_{REF}$.

The frequency synthesizer using PLL is generally capable of reducing the phase noise of the VCO within a loop band of PLL. However, it is unable to reduce the phase noise of the VCO outside the loop band of PLL. Moreover, a too wide loop band of PLL gives rise to a problem that spurious occurs at a frequency separated by $\pm f_{REF}$ from the oscillation frequency $f_{OUT}$ of the VCO. Because of this, it is impossible to widen the loop band more than a given width. Thus, it is required that the phase noise of the VCO itself is sufficiently low.

The oscillator of the present invention can solve the problems discussed as key points (1) to (4) for phase noise reduction regarding the conventional example. It also can decrease the phase variation sensitivity to harmonic distortions and increase the amplitude of the oscillation voltage. The above-described feature is fulfilled constantly even if the oscillation frequency is varied by using a variable capacitor, as noted previously. It is thus possible to realize a frequency synthesizer having a low phase noise.

Embodiment 9

Figure 26:
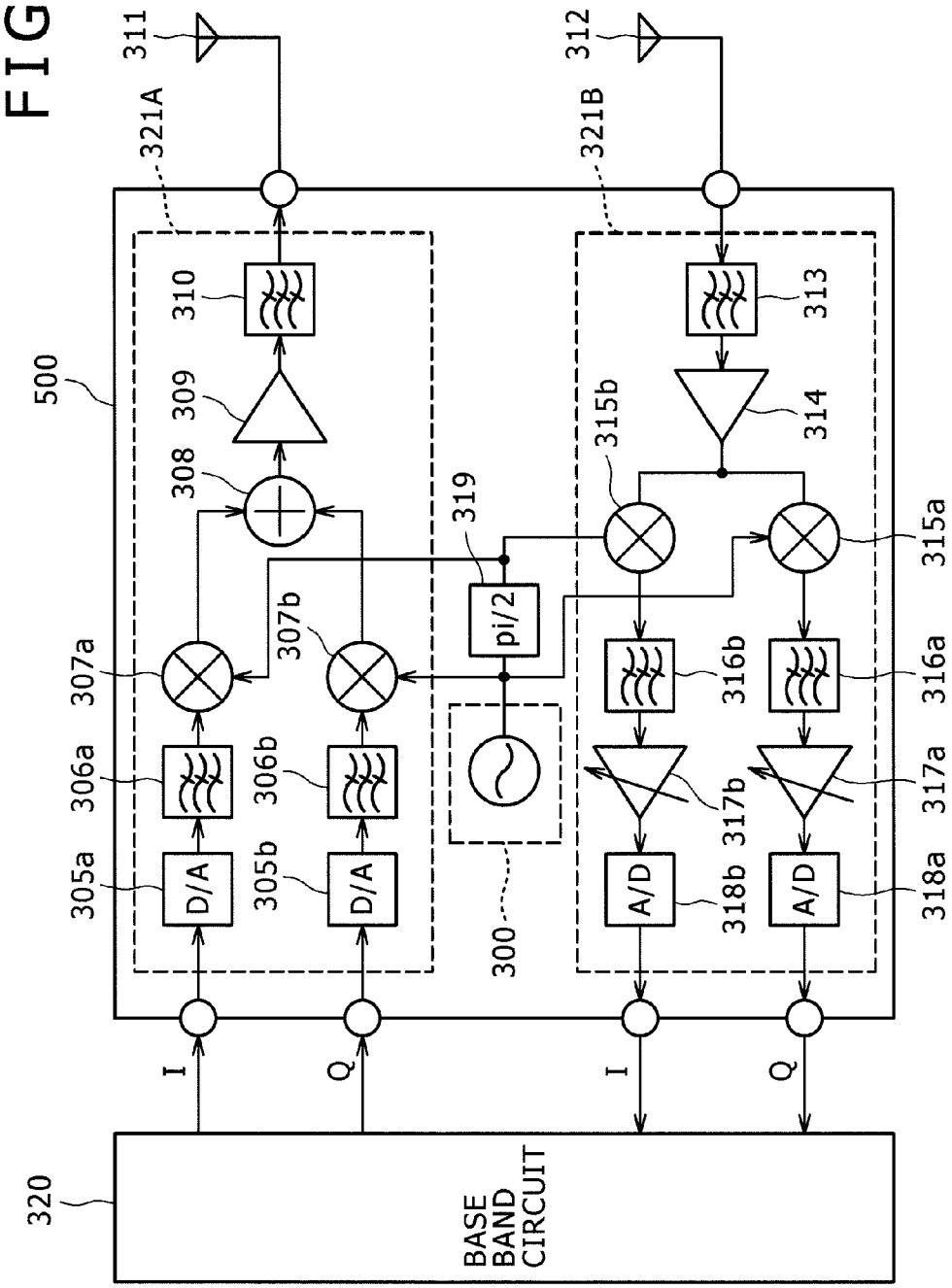
FIG. 26 is a block diagram showing a direct conversion wireless transceiving system according to a ninth embodiment of the present invention.

Then, a direct conversion wireless transceiving system according to a ninth embodiment of the present invention is described. FIG. 26 is a block diagram showing an example of a wireless communication system according to the ninth embodiment of the present invention. In the ninth embodiment, any oscillator described in one of the above-described embodiments is applied in a direct conversion wireless transceiver.

The wireless transceiver of the ninth embodiment is made up of a baseband IC 320, an RFIC 500 including the oscillator of the present invention, a transmitting antenna 311, and a receiving antenna 312. The RFIC 500 comprises a transmission unit 321A, a receiving unit 321B, and a frequency synthesizer 300. In the transmission unit 321A, digital I and Q signals supplied from the baseband IC 320 are converted to I, Q signals in an analog domain through D/A converters 305a, 305b which performs digital to analog conversion. The analog I, Q signals are, after their unwanted components are attenuated by low pass filters 306a, 306b, input to two mixers 307a 307b. A local signal generated from the frequency synthesizer 300 and its 90° phase difference signal, phase shifted by a 90° phase shifter 319, are input to the mixers 307a, 307b. The input signals which have been up converted into a RF frequency band by the frequency conversion function of the mixers and converted to I phase are converged into one path by an adder 308. The signals whose power has been amplified by a power amplifier 309 are, after their unwanted frequency components are attenuated by a band pas filter 310, supplied to the transmitting antenna 311 from which they are radiated into space.

On the other hand, in the receiving unit 321B, reversely, received signals in an RF frequency band received by the receiving antenna 312 are, after their unwanted frequency components are attenuated by a band pass filter 312, amplified by a low noise amplifier 314, while maintained at a good SNR, and then input to two mixers 315a, 315b. A local signal generated from the frequency synthesizer 300 and its 90° phase difference signal, phase shifted by a 90° phase shifter 319, are input to the mixers 315a, 315b. The received signals with a frequency converted into a baseband frequency are output from the mixers and separated into I phase and Q phase signals. Unwanted frequency components of these I and Q signals are attenuated by low pass filters 316a, 316b. The I and Q signals are, after amplified to a proper received signal level by variable gain amplifiers 317a, 317b, converted into corresponding signals in a digital domain by A/D converters 318 and output to the baseband circuit IC.

Any oscillator described in one of the above-described embodiments is incorporated into the frequency synthesizer 300 in the thus configured direct conversion wireless communication system. Thereby, because a frequency synthesizer having a good phase noise characteristic can be fabricated, it is possible to realize a wireless communication system having a long radio transmission range and a low bit error rate.

Although, in the present embodiment, the A/D converters and the D/A converters are located within the RFIC and digital signals are transferred to/from the baseband IC, the system may be configured such that the A/D converters and the D/A converters are located in the baseband IC and analog signals are transferred between the RFIC and the baseband IC.

According to the ninth embodiment, the phase of the second harmonic voltage generated from the oscillator can be fixed to a phase in which the ISF of channel thermal noise becomes minimum. As a result, it is possible to reduce the phase noise deterioration due to oscillation voltage waveform distortions and increase the amplitude of the oscillation voltage. It is possible to realize a communication system having a low phase noise characteristic.

Embodiment 10

Figure 27:
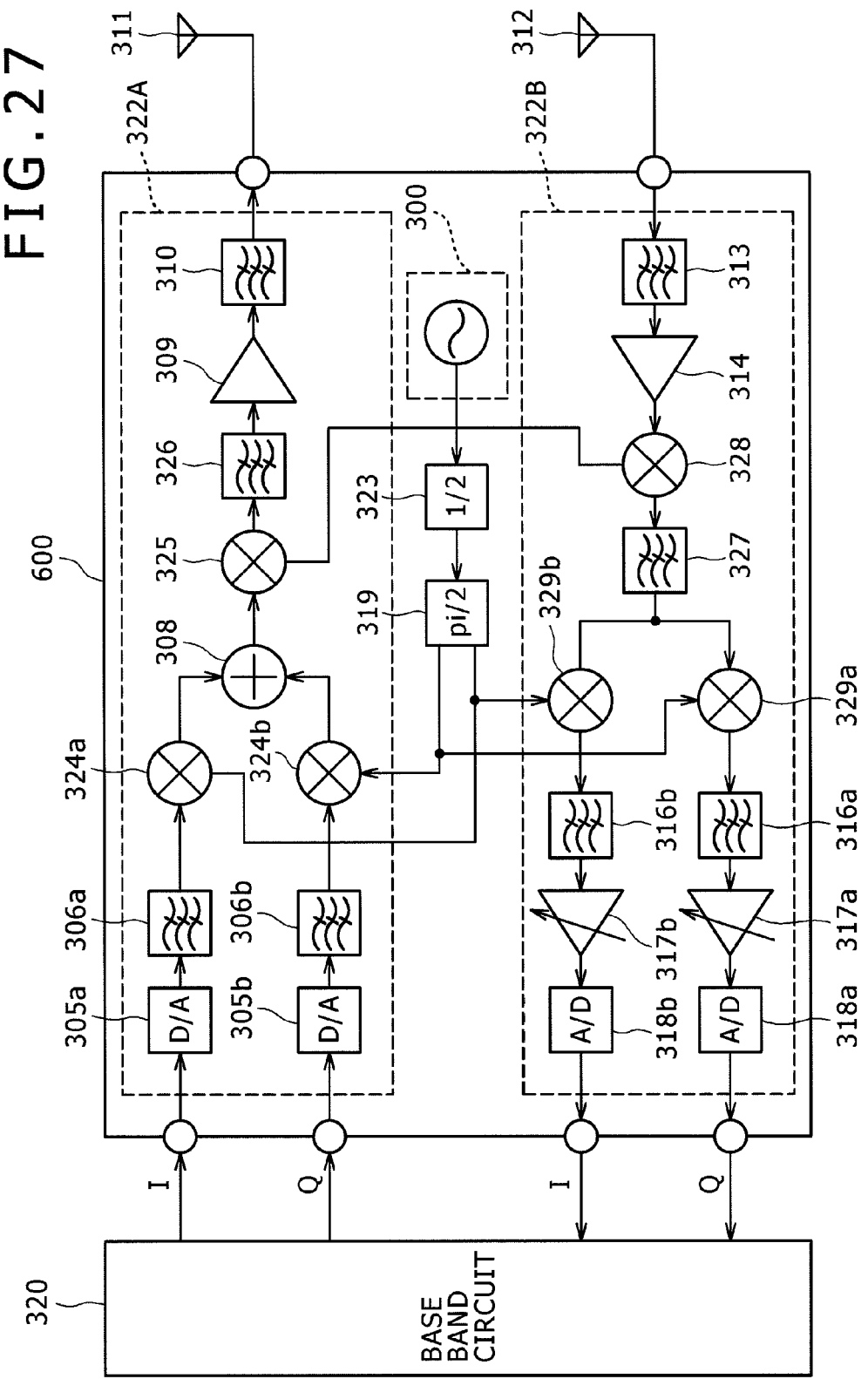
FIG. 27 is a block diagram showing a superheterodyne wireless transceiving system according to a tenth embodiment of the present invention.

Then, a superheterodyne wireless transceiving system according to a tenth embodiment of the present invention is described. FIG. 27 is a block diagram showing an example of a wireless communication system of the present invention. In the tenth embodiment, any oscillator described in one of the above-described embodiments is applied in a sliding IF type superheterodyne transceiver.

The wireless transceiver of the tenth embodiment is made up of a baseband IC 320, an RFIC 600 including the oscillator of the present invention, a transmitting antenna 311, and a receiving antenna 312. The RFIC 600 comprises a transmission unit 322A, a receiving unit 322B, and a frequency synthesizer 300. In the transmission unit 322A, digital I and Q signals supplied from the baseband circuit IC 320 are converted to I, Q signals in an analog domain through D/A converters 305a, 305b which performs digital to analog conversion. The analog I, Q signals are, after their unwanted components are attenuated by low pass filters 306a, 306b, input to two mixers 307a 307b. A local signal generated from the frequency synthesizer 300 is input to a transmission RF mixer 3256 and a receiving RF mixer 328. Moreover, the local signal is turned into a signal with a ½ frequency of the local signal frequency by a frequency divider by two 323 and with a 90° phase difference, phase shifted by a 90° phase shifter 319. The latter signal is input to the mixers 324a, 324b and receiving IF mixers 329a, 329b.

The input signals which have been up converted into a IF (Intermediate Frequency) frequency band by the frequency conversion function of the mixers and converted to I phase are converged into one path by an adder 308 and input to an RF mixer 325. The signals converted into an RF frequency band are output from the RF mixer and their unwanted frequency components in a high range are attenuated by a high pass filter 326. The signals whose power has been amplified by a power amplifier 309 are, after their unwanted frequency components are attenuated by a band pas filter 310, supplied to the transmitting antenna 311 from which they are radiated into space.

On the other hand, in the receiving unit 322B, reversely, received signals in an RF frequency band received by the receiving antenna 312 are, after their unwanted frequency components are attenuated by a band pass filter 313, amplified by a low noise amplifier 314, while maintained at a good SNR, and then input to an RF mixer 328. The received signals with a frequency converted into an IF frequency are output from the RF mixer and, after their unwanted frequency components are attenuated by a band pas filter 313, are input to IF mixers 329a, 329b. The received signals are frequency converted into a baseband frequency and separated into I phase and Q phase signals. Unwanted frequency components of these I and Q signals are attenuated by low pass filters 316a, 316b. The I and Q signals are, after amplified to a proper received signal level by variable gain amplifiers 317a, 317b, converted into corresponding signals in a digital domain by A/D converters 318 and output to the baseband circuit IC.

Any oscillator described in one of the above-described embodiments is incorporated into the frequency synthesizer 300 in the thus configured superheterodyne wireless communication system. Thereby, because a frequency synthesizer having a good phase noise characteristic can be fabricated, it is possible to realize a wireless communication system having a long radio transmission range and a low bit error rate.

Although, in the present embodiment, the A/D converters and the D/A converters are located within the RFIC and digital signals are transferred to/from the baseband IC, the system may be configured such that the A/D converters and the D/A converters are located in the baseband IC and analog signals are transferred between the RFIC and the baseband IC.

According to the tenth embodiment, the phase of the second harmonic voltage generated from the oscillator can be fixed to a phase in which the ISF of channel thermal noise becomes minimum. As a result, it is possible to reduce the phase noise deterioration due to oscillation voltage waveform distortions and increase the amplitude of the oscillation voltage. It is possible to realize a communication system having a low phase noise characteristic.

What is claimed is:

1. An oscillator comprising at least one voltage to current converter converting a voltage into a current and at least one resonator,
    wherein the resonator including a pair of LC tanks, each of said LC tanks being formed of a capacitive element and an inductive element connected in parallel,
    wherein a feedback loop is formed such that an output terminal of the voltage to current converter is connected to the resonator and an output terminal of the resonator is connected to an input terminal of the voltage to current converter,
    wherein inductive elements constituting the pair of LC tanks constituting the resonator are mutually inductively coupled,
    wherein two capacitive elements constituting the pair of LC tanks have virtually equal capacitance values and two inductive elements have virtually equal self-inductances, and
    wherein a coefficient of mutual induction between the inductive elements is set to a predetermined value, based on a relation between the phase of a fundamental signal and the phase of a second harmonic generated from the oscillator.

2. The oscillator according to claim 1,
    wherein the coefficient of mutual induction between the inductive elements is between about −0.5 and −0.8.

3. The oscillator according to claim 1,
    wherein the coefficient of mutual induction between the inductive elements is between about −0.6.

4. The oscillator according to claim 1,
wherein a ratio between a first parallel resonance frequency and a second parallel resonance frequency of the resonator is about 1:2.

5. The oscillator according to claim 1,
wherein the capacitive elements constituting the pair of LC tanks are a combination of a plurality of AC grounded capacitors.

6. The oscillator according to claim 5,
wherein at least one capacitive element out of the plurality of AC grounded capacitors changes is adapted such that its capacitance value is changed by a voltage applied to it.

7. The oscillator according to claim 5,
wherein the voltage to current converter comprises a MOS transistor or a bipolar transistor, and
wherein an input terminal of the voltage to current converter becomes a gate terminal of the MOS transistor a base terminal of the bipolar transistor and an output terminal of the voltage to current converter becomes a drain terminal of the MOS transistor a collector terminal of the bipolar transistor.

8. The oscillator according to claim 7,
wherein two resistive elements or two capacitive elements are connected in series between the input terminal and the output terminal of the voltage to current converter and a middle point between the resistive elements or the capacitive elements is the output terminal of the oscillator.

9. The oscillator according to claim 1,
wherein the inductive elements constituting the pair of LC tanks of the resonator are configured in two separate layers, one being a revolute turn wiring layer and the other being an involute turn wiring layer, one on top of another, the upper layer and the lower layer being inverted in a middle point, and the inductive elements are configured so that currents flow in the same direction in the inductive elements.

10. The oscillator according to claim 9,
wherein the inductive elements constituting the pair of LC tanks of the resonator are configured to be symmetric with respect to a center line of the resonator.

11. The oscillator according to claim 1,
wherein the resonator comprises a first resonator and a second resonator,
wherein a pair of first and second inductive elements constituting the first resonator and a pair of first and second inductive elements constituting the second resonator are disposed, spaced apart from each other on a chip to decrease the coefficient of mutual induction between them to a negligible level, and
wherein a pair of the first inductive element of the first resonator and the first inductive element of the second resonator and a pair of the second inductive element of the first resonator and the second inductive element of the second resonator are disposed close to each other on the chip.

12. The oscillator according to claim 11,
wherein the first inductive element of the first resonator and the first inductive element of the second resonator are made of an upper thicker metal layer, and
wherein the second inductive element of the first resonator and the second inductive element of the second resonator are made of a lower thinner metal layer.

13. The oscillator according to claim 1,
wherein the inductive elements are configured in two layers of spiral inductors which are mutually inductively coupled in a negative direction.

14. A frequency generating circuit comprising an oscillator and a frequency multiplier multiplying a frequency by a integer factor and outputting a multiplied frequency by inputting a primary oscillation signal output from the oscillator to the frequency multiplier,
wherein the oscillator including at least one voltage to current converter converting a voltage into a current and at least one resonator,
wherein the resonator including a pair of LC tanks, each of said LC tanks being formed of a capacitive element and an inductive element connected in parallel,
wherein a feedback loop is formed such that an output terminal of the voltage to current converter is connected to the resonator and an output terminal of the resonator is connected to an input terminal of the voltage to current converter,
wherein inductive elements constituting the pair of LC tanks constituting the resonator are mutually inductively coupled,
wherein capacitive elements constituting the pair of LC tanks have virtually equal capacitance values and two inductive elements have virtually equal self-inductances, and
wherein a coefficient of mutual induction between the inductive elements is set to a predetermined value, based on a relation between the phase of a fundamental signal and the phase of a second harmonic generated from the oscillator.

15. The frequency generating circuit according to claim 14, further comprising:
a reference frequency generator;
a divider capable of dividing a frequency by an arbitrary division number;
a phase comparator detecting a phase difference between an output signal of the reference frequency generator and an output signal of the divider;
a charge pump producing a voltage in proportion to the phase difference; and
a loop filter,
wherein the frequency generating circuit generates a frequency by multiplying the division number of the divider and the reference frequency.

16. The frequency generating circuit according to claim 14,
wherein a coefficient of mutual induction between inductive elements of the oscillator is between about −0.5 and −0.8.

17. A wireless communication system comprising a transmission unit, a receiving unit, and a frequency generating circuit comprising an oscillator for generating a frequency that is used in at least either of the transmission unit and the receiving unit,
wherein the oscillator including at least one voltage to current converter converting a voltage into a current and at least one resonator,
wherein the resonator including a pair of LC tanks, each of said LC tanks being formed of a capacitive element and an inductive element connected in parallel,
wherein a feedback loop is formed such that an output terminal of the voltage to current converter is connected to the resonator and an output terminal of the resonator is connected to an input terminal of the voltage to current converter, wherein inductive elements constituting the pair of LC tanks constituting the resonator are mutually inductively coupled, wherein two capacitive elements constituting the pair of LC tanks have virtually equal capacitance values and two inductive elements have virtually equal self-inductances, and wherein a coefficient of mutual induction between the inductive elements is set to a predetermined value, based on a relation between the phase of a fundamental signal and the phase of a second harmonic generated from the oscillator.

18. The wireless communication system according to claim 17, wherein a coefficient of mutual induction between inductive elements of the oscillator is between about −0.5 and −0.8.

19. The wireless communication system according to claim 18, further comprising:

a first mixer for modulating data signals from baseband to radio frequency;

a frequency generating circuit for generating a local signal for driving the first mixer;

a first filter circuit for attenuating unwanted frequency components of modulated radio frequency signals output from the first mixer;

a power amplifier for gaining sufficient power to drive an antenna from modulated radio frequency signals output from the first filter circuit;

a low noise amplifier amplifying modulated radio frequency signals received from an antenna;

a second filter circuit for attenuating unwanted frequency components of output signals from the low noise amplifier;

a second mixer for demodulating modulated signals output from the second filter circuit;

a third filter circuit for attenuating unwanted frequency components of data signals demodulated by the second mixer; and a variable gain amplifier for amplifying data signals output from the third filter circuit to a proper signal level, wherein the frequency generating circuit for generating the local signal includes the frequency generating circuit.

20. The wireless communication system according to claim 18, wherein the frequency generating circuit is adapted to be incorporated in a superheterodyne wireless communication system.

* * * * *